US010102919B2

(12) United States Patent
Ma

(10) Patent No.: US 10,102,919 B2
(45) Date of Patent: Oct. 16, 2018

(54) SHIFT REGISTER, GATE DRIVING CIRCUIT AND DISPLAY DEVICE

(71) Applicant: BOE Technology Group Co., Ltd., Beijing (CN)

(72) Inventor: Zhanjie Ma, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 111 days.

(21) Appl. No.: 15/320,534

(22) PCT Filed: Mar. 25, 2016

(86) PCT No.: PCT/CN2016/077294
§ 371 (c)(1),
(2) Date: Dec. 20, 2016

(87) PCT Pub. No.: WO2017/045390
PCT Pub. Date: Mar. 23, 2017

(65) Prior Publication Data
US 2018/0211716 A1  Jul. 26, 2018

(30) Foreign Application Priority Data

Sep. 18, 2015 (CN) .......................... 2015 1 0600147

(51) Int. Cl.
*G11C 19/00* (2006.01)
*G11C 19/28* (2006.01)
(Continued)

(52) U.S. Cl.
CPC ............. *G11C 19/28* (2013.01); *G09G 3/20* (2013.01); *G09G 3/3677* (2013.01); *G09G 2310/0286* (2013.01); *G09G 2310/08* (2013.01)

(58) Field of Classification Search
None
See application file for complete search history.

(56) References Cited

U.S. PATENT DOCUMENTS

2011/0228892 A1   9/2011  Lai
2015/0155052 A1*  6/2015  Ma ........................... G09G 3/36
                                                         345/100

(Continued)

FOREIGN PATENT DOCUMENTS

CN    104124430 A    10/2014
CN    104134430 A    11/2014
(Continued)

OTHER PUBLICATIONS

Jun. 30, 2016—International Search Report and Written Opinion Appn PCT/CN2016/077294 with Eng Tran.

*Primary Examiner* — Tuan T Lam
(74) *Attorney, Agent, or Firm* — Banner & Witcoff, Ltd.

(57) ABSTRACT

A shift register, a gate driving circuit and a display device are provided. The shift register includes an input module, a first control module, a second control module, a first output module, and a second output module. The shift register can control a time length of the scanning signal outputted from the driving signal output terminal only by changing a time length of the input signal without changing the clock signal or the circuit or the manufacturing process, and can reduce difficulty of the gate driving circuit and complexity of the manufacturing process as well as the cost.

20 Claims, 10 Drawing Sheets

(51) Int. Cl.
*G09G 3/20* (2006.01)
*G09G 3/36* (2006.01)

(56) References Cited

U.S. PATENT DOCUMENTS

| | | | |
|---|---|---|---|
| 2017/0200418 A1* | 7/2017 | Zhang | G09G 3/3266 |
| 2017/0200419 A1* | 7/2017 | Ma | G09G 3/3266 |
| 2017/0278450 A1* | 9/2017 | Ma | G09G 3/2092 |
| 2017/0301407 A1* | 10/2017 | Ma | G11C 19/28 |
| 2017/0330633 A1* | 11/2017 | Sun | G11C 19/186 |

FOREIGN PATENT DOCUMENTS

| | | |
|---|---|---|
| CN | 204257215 U | 4/2015 |
| CN | 105047124 A | 11/2015 |
| TW | 201501127 A | 1/2015 |

* cited by examiner

SHIFT REGISTER, GATE DRIVING CIRCUIT AND DISPLAY DEVICE

The application is a U.S. National Phase Entry of International Application No. PCT/CN2016/077294 filed on Mar. 25, 2016, designating the United States of America and claiming priority to Chinese Patent Application No. 201510600147.9 filed on Sep. 18, 2015. The present application claims priority to and the benefit of the above-identified applications and the above-identified applications are incorporated by reference herein in their entirety.

TECHNICAL FIELD

The present disclosure relates to a shift register, a gate driving circuit and a display device.

BACKGROUND

With rapid development of display techniques, displays show a development trend of high integration and low cost. The Gate Driver on Array (GOA) technique integrates gate switching circuits of a Thin Film Transistor (TFT) on an array substrate of a display panel to form a scan driving to the display panel, so as to leave out wiring space of a bonding area of a gate Integrated Circuit (IC) and a Fan-out area, which can not only reduce product cost in two aspects of both material cost and manufacturing process, but also achieve symmetry on both sides of the display panel and a beautiful design of a narrow border. And such integration technique can also eliminate the need of bonding process in a gate scanning line direction, thus improve productivity and yield.

A GOA circuit is usually composed by a plurality of cascaded shift registers, wherein driving signal output terminals of the shift registers in each stage correspond to one gate line, so that the gate lines are arranged in order along a scanning direction. In general, a scanning time length for each row of gate lines is fixed. Therefore, the GOA circuit described above is not applicable to a display device that needs to adjust the scanning time length for each row of gate lines according to situations. Although different clock control signals can be used to achieve adjustment of the scanning time length, this requires using multiple clock controllers, and for a different scanning time length, the cascade relationship among the shift registers in the GOA circuit is also different, resulting in that it has become more difficult to apply the GOA circuit to the display device that needs to adjust the scanning time length for each row of gate lines according to situations, and production cost of such display device is increased, causing the corresponding display device not competitive.

SUMMARY

The present disclosure provides a shift register, a gate driving circuit and a display device, which can adjust a time length of outputted scanning signals only by changing a time length of inputted signals, without inputting too many clock signals, so as to solve the problem of complicated manufacturing process caused by adopting a plurality of clock control signals to adjust the scanning time length for gate lines in the GOA circuit.

Accordingly, an embodiment of the present disclosure provides a shift register, comprising an input module, a first control module, a second control module, a first output module and a second output module.

A first terminal of the input module is configured to receive an input signal, a second terminal of the input module is configured to receive a first clock signal, and a third terminal of the input module is connected to a first node. The input module is configured to supply the input signal to the first node when a potential of the first clock signal is a first potential.

A first terminal of the first control module is configured to receive the first clock signal, a second terminal of the first control module is configured to receive a second clock signal, a third terminal of the first control module is configured to receive a first DC (direct current) signal, a fourth terminal of the first control module is configured to receive a second DC signal, a fifth terminal of the first control module is connected to the first node, and a sixth terminal of the first control module is connected to a second node. The first control module is configured to supply the first DC signal to the second node when a potential of the first node is a first potential, supply the second DC signal to the second node when a potential of the first clock signal is a first potential, and maintain a voltage difference between the second terminal and the second node at current voltage difference when the second node is in a floating state.

A first terminal of the second control module is configured to receive the second clock signal, a second terminal of the second control module is configured to receive the first DC signal, a third terminal of the second control module is configured to receive the second DC signal, a fourth terminal of the second control module is connected to the first node, a fifth terminal of the second control module is connected to the second node, and a sixth terminal of the second control module is connected to a third node. The second control module is configured to supply the first DC signal to the third node when a potential of the first node is a first potential, supply the second DC signal to the third node when a potential of the first clock signal and a potential of the second node are both first potentials, and maintain a voltage difference between the first terminal thereof and the third node at current voltage difference when the third node is in a floating state.

A first terminal of the first output module is configured to receive the second DC signal, a second terminal of the first output module is connected to the first node, and a third terminal of the first output module is connected to a driving signal output terminal of the shift register. The first output module is configured to supply the second DC signal to the driving signal output terminal when a potential of the first node is a first potential, and maintain a voltage difference between the first node and the driving signal output terminal at current voltage difference when the first node is in a floating state.

A first terminal of the second output module is configured to receive the first DC signal, a second terminal of the second output module is connected to the third node, and a third terminal of the second output module is connected to the driving signal output terminal. The second output module is configured to supply the first DC signal to the driving signal output terminal when a potential of the third node is a first potential.

In an embodiment, in a case where an effective pulse signal of the input signal is a high potential, the first potential is a low potential, the first DC signal is a high potential, and the second DC signal is a low potential. Alternatively, in a case where an effective pulse signal of the input signal is a low potential, the first potential is a high potential, the first DC signal is a low potential, and the second DC signal is a high potential.

In an embodiment, the input module comprises a first switching transistor, wherein a gate of the first switching transistor is configured to receive the first clock signal, a source of the first switching transistor is configured to receive the input signal, and a drain of the first switching transistor is connected to the first node.

In an embodiment, the first control module comprises a second switching transistor, a third switching transistor and a first capacitor, wherein a gate of the second switching transistor is configured to receive the first clock signal, a source of the second switching transistor is configured to receive the second DC signal, and a drain of the second switching transistor is connected to the second node, a gate of the third switching transistor is connected to the first node, a source of the third switching transistor is configured to receive the first DC signal, and a drain of the third switching transistor is connected to the second node, and one terminal of the first capacitor is configured to receive the second clock signal, and the other terminal of the first capacitor is connected to the second node.

In an embodiment, the second control module comprises a fourth switching transistor, a fifth switching transistor, a sixth switching transistor and a second capacitor, wherein a gate of the fourth switching transistor is connected to the first node, a source of the fourth switching transistor is configured to receive the first DC signal, and a drain of the fourth switching transistor is connected to the third node, a gate of the fifth switching transistor is connected to the second node, a source of the fifth switching transistor is configured to receive the second DC signal, and a drain of the fifth switching transistor is connected to a source of the sixth switching transistor, a gate of the sixth switching transistor is configured to receive the second clock signal, and a drain of the sixth switching transistor is connected to the third node, and one terminal of the second capacitor is configured to receive the second clock signal, and the other terminal of the second capacitor is connected to the third node.

In an embodiment, the first output module comprises a seventh switching transistor and a third capacitor, wherein a gate of the seventh switching transistor is connected to the first node, a source of the seventh switching transistor is configured to receive the second DC signal, and a drain of the seventh switching transistor is connected to the driving signal output terminal, and one terminal of the third capacitor is connected to the first node, and the other terminal of the third capacitor is connected to the driving signal output terminal.

In an embodiment, the second output module comprises an eighth switching transistor, wherein a gate of the eighth switching transistor is connected to the third node, a source of the eighth switching transistor is configured to receive the first DC signal, and a drain of the eighth switching transistor is connected to the driving signal output terminal.

In an embodiment, in a case where an effective pulse signal of the input signal is a high potential, all the switching transistors are P-type switching transistors; in a case where an effective pulse signal of the input signal is a low potential, all the switching transistors are N-type switching transistors.

Further, in an embodiment, cycles of the first clock signal and the second clock signal are the same, and duty ratios of the first clock signal and the second clock signal are the same;

in a case where an effective pulse signal of the input signal is a high potential, a rising edge of the input signal and a falling edge of the first clock signal are aligned, a falling edge of the input signal and a falling edge of the second clock signal are aligned, a period with the first clock signal being a low potential within one cycle resides during a period with the second clock signal being a high potential within one cycle, and the duty ratio of the first clock signal and the duty ratio of the second clock are both greater than 0.5, in a case where an effective pulse signal of the input signal is a low potential, a falling edge of the input signal and a rising edge of the first clock signal are aligned, a rising edge of the input signal and a rising edge of the second clock signal are aligned, a period with the first clock signal being a high potential within one cycle resides during a period with the second clock signal being a low potential within one cycle, and the duty ratio of the first clock signal and the duty ratio of the second clock are both smaller than 0.5.

Further, an embodiment of the present disclosure provides a gate driving circuit comprising a plurality of cascaded shift registers, any of which is provided in the embodiments of the present disclosure, wherein an input signal of the shift register in a first stage is inputted via a start signal terminal, and except the shift register in the first stage, an input signal of the shift register in each stage is inputted via a driving signal output terminal of the shift register connected thereto in a previous stage.

Further, an embodiment of the present disclosure provides a display device, comprising any of the gate driving circuits provided by the embodiments of the present disclosure.

The shift register provided by the present disclosure comprises an input module, a first control module, a second control module, a first output module and a second output module, wherein the input module adjusts a potential of the first node through the input signal and the first clock signal, the first control module adjusts a potential of the second node through the first clock signal, the second clock signal, the first DC signal, the second DC signal and the first node, the second control module adjusts a potential of the third node through the second clock signal, the first DC signal, the second DC signal, the first node and the second node, the first output module adjusts a potential of the driving signal output terminal through the second DC signal and the first node, and the second output module adjusts a potential of the driving signal output terminal through the first DC signal and the second node. Thus, the shift register provided by the present disclosure can control a time length of the scanning signal outputted from the driving signal output terminal only by changing a time length of the input signal without changing the clock signal or the circuit or the manufacturing process. Accordingly, the shift register provided by the present disclosure can reduce difficulty of the gate driving circuit and complexity of the manufacturing process as well as the cost, as compared with the manner of using a plurality of types of clock control signals to control a time length of the scanning signal outputted from the driving signal output terminal.

BRIEF DESCRIPTION OF THE DRAWINGS

FIGS. 3a to 3c are circuit timing diagrams of the shift register shown in FIG. 2a.

DETAILED DESCRIPTION OF THE EMBODIMENTS

Hereinafter, the shift register, the gate driving circuit and the related display device provided by the embodiments of the present disclosure will be described in detail in combination with the drawings.

Figure 1:
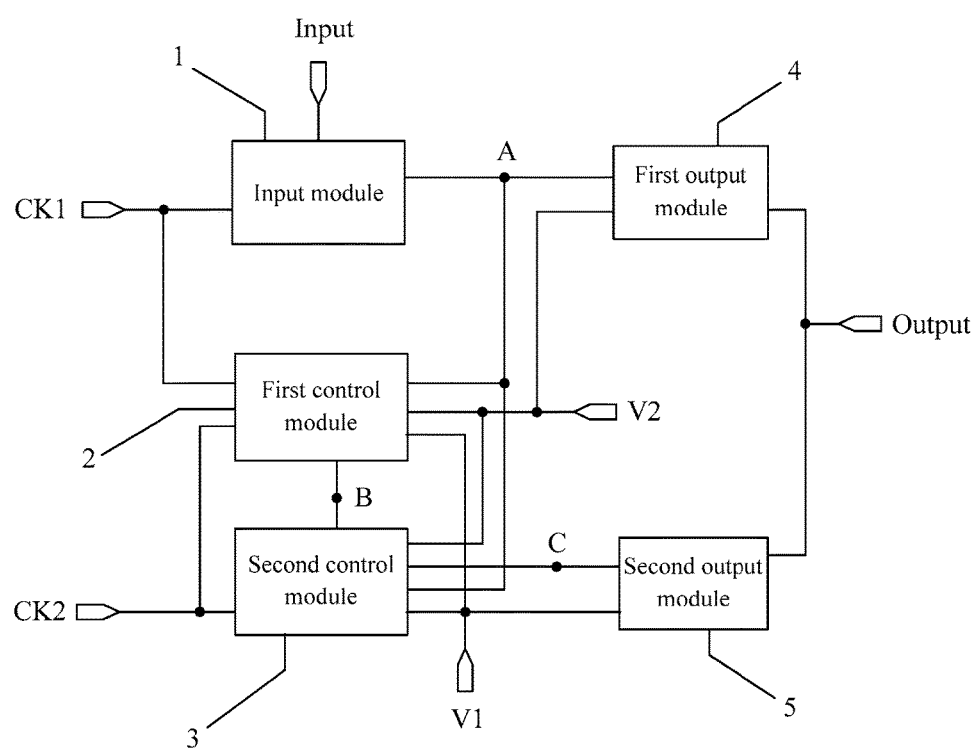
FIG. 1 is a schematic diagram of structure of the shift register provided by an embodiment of the present disclosure.

FIG. 1 schematically shows the shift register provided by an embodiment of the present disclosure, the shift register comprises an input module 1, a first control module 2, a second control module 3, a first output module 4 and a second output module 5.

A first terminal of the input module 1 is configured to receive an input signal Input, a second terminal of the input module 1 is configured to receive a first clock signal CK1, and a third terminal of the input module 1 is connected to a first node A. The input module 1 can supply the input signal Input to the first node A when a potential of the first clock signal CK1 is a first potential.

A first terminal of the first control module 2 is configured to receive the first clock signal CK1, a second terminal of the first control module 2 is configured to receive a second clock signal CK2, a third terminal of the first control module 2 is configured to receive a first DC signal V1, a fourth terminal of the first control module 2 is configured to receive a second DC signal V2, a fifth terminal of the first control module 2 is connected to the first node A, and a sixth terminal of the first control module 2 is connected to a second node B. The first control module 2 can supply the first DC signal V1 to the second node B when a potential of the first node A is a first potential, supply the second DC signal V2 to the second node B when a potential of the first clock signal CK1 is a first potential, and maintain a voltage difference between the second terminal of the first control module 2 and the second node B at current voltage difference when the second node B is in a floating state.

A first terminal of the second control module 3 is configured to receive the second clock signal CK2, a second terminal of the second control module 3 is configured to receive the first DC signal V1, a third terminal of the second control module 3 is configured to receive the second DC signal V2, a fourth terminal of the second control module 3 is connected to the first node A, a fifth terminal of the second control module 3 is connected to the second node B, and a sixth terminal of the second control module 3 is connected to a third node C. The second control module 3 can supply the first DC signal V1 to the third node C when a potential of the first node A is a first potential, supply the second DC signal V2 to the third node C when a potential of the first clock signal CK1 and a potential of the second node B are both first potentials, and maintain a voltage difference between the first terminal thereof and the third node C at current voltage difference when the third node C is in a floating state.

A first terminal of the first output module 4 is configured to receive the second DC signal V2, a second terminal of the first output module 4 is connected to the first node A, and a third terminal of the first output module 4 is connected to a driving signal output terminal Output of the shift register. The first output module 4 can supply the second DC signal V2 to the driving signal output terminal Output when a potential of the first node A is a first potential, and maintain a voltage difference between the first node A and the driving signal output terminal Output at current voltage difference when the first node A is in a floating state.

A first terminal of the second output module 5 is configured to receive the first DC signal V1, a second terminal of the second output module 5 is connected to the third node C, and a third terminal of the second output module 5 is connected to the driving signal output terminal Output. The second output module 5 can supply the first DC signal V1 to the driving signal output terminal Output when a potential of the third node C is a first potential.

Optionally, in a case where an effective pulse signal of the input signal Input is a high potential, the first potential may be a low potential, the first DC signal V1 may be a high potential, and the second DC signal V2 may be a low potential. Alternatively, in a case where an effective pulse signal of the input signal Input of the input signal Input is a low potential, the first potential may be a high potential, the first DC signal V1 may be a low potential, and the second DC signal V2 may be a high potential.

The shift register described above comprises an input module, a first control module, a second control module, a first output module and a second output module, wherein the input module adjusts a potential of the first node through the input signal and the first clock signal, the first control module adjusts a potential of the second node through the first clock signal, the second clock signal, the first DC signal, the second DC signal and the first node, the second control module adjusts a potential of the third node through the second clock signal, the first DC signal, the second DC signal, the first node and the second node, the first output module adjusts a potential of the driving signal output terminal through the second DC signal and the first node, and the second output module adjusts a potential of the driving signal output terminal through the first DC signal and the second node. Thus, the shift register provided by the present disclosure can control a time length of the scanning signal outputted from the driving signal output terminal only by changing a time length of the input signal without changing the clock signal or the circuit or the manufacturing process. Accordingly, the shift register provided by the present disclosure can reduce difficulty of the gate driving circuit and complexity of the manufacturing process as well as the cost, as compared with the manner of using a plurality of types of clock control signals to control a time length of the scanning signal outputted from the driving signal output terminal.

Further, in the shift register described above, cycles of the first clock signal and the second clock signal may be the same, and duty ratios of the first clock signal and the second clock signal may be the same.

In a case where an effective pulse signal of the input signal Input is a high potential, a rising edge of the input signal Input and a falling edge of the first clock signal are aligned, a falling edge of the input signal Input and a falling edge of the second clock signal are aligned, a period with the first clock signal being a low potential within one cycle resides during a period with the second clock signal being a high potential within one cycle, and the duty ratio of the first clock signal and the duty ratio of the second clock are both greater than 0.5

In a case where an effective pulse signal of the input signal Input is a low potential, a falling edge of the input signal Input and a rising edge of the first clock signal are aligned, a rising edge of the input signal Input and a rising edge of the second clock signal are aligned, a period with the first clock signal being a high potential within one cycle resides during a period with the second clock signal being a low potential within one cycle, and the duty ratio of the first clock signal and the duty ratio of the second clock are both smaller than 0.5.

Next, the present disclosure will be described in detail in combination with embodiments. It should to be noted that the embodiments are to interpret the present disclosure better, not intended to limit the present disclosure.

Optionally, in the shift register described above, as shown in FIGS. 2a and 3b, the input module 1 may comprise a first switching transistor M1, wherein a gate of the first switching transistor M1 is configured to receive the first clock signal CK1, a source of the first switching transistor M1 is configured to receive the input signal Input, and a drain of the first switching transistor M1 is connected to the first node A.

Figure 2A:
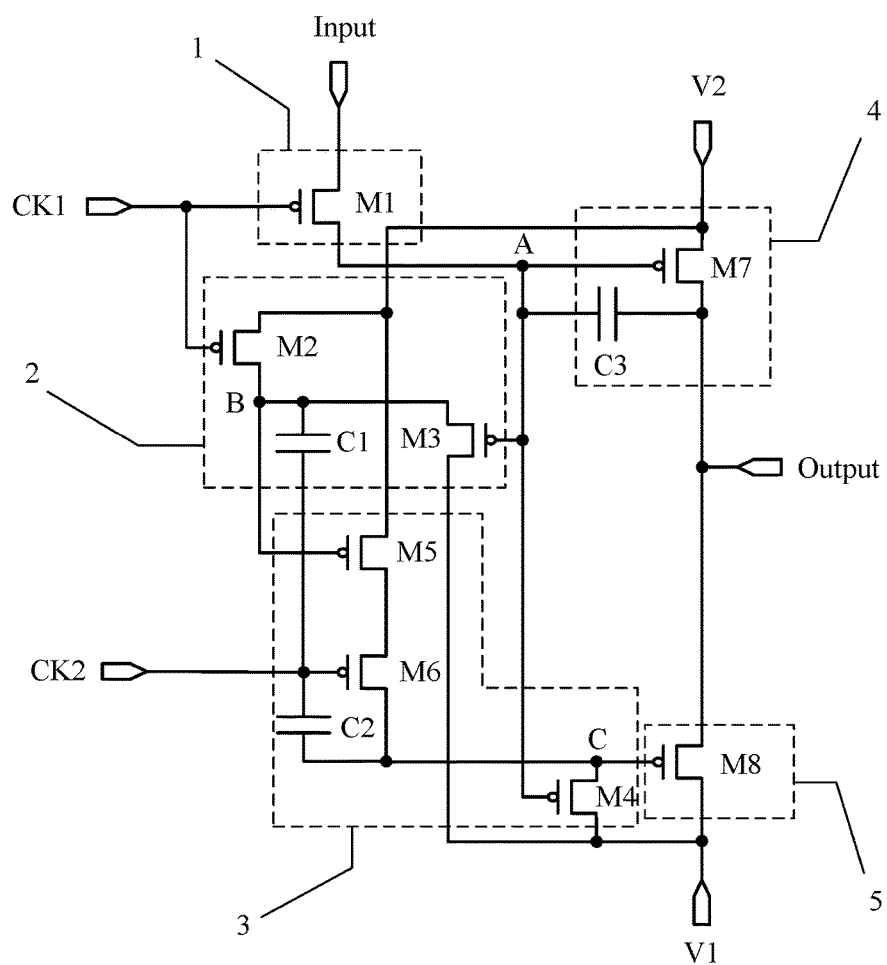
FIG. 2a is a schematic diagram of structure of the shift register provided by an embodiment of the present disclosure.
Figure 2B:
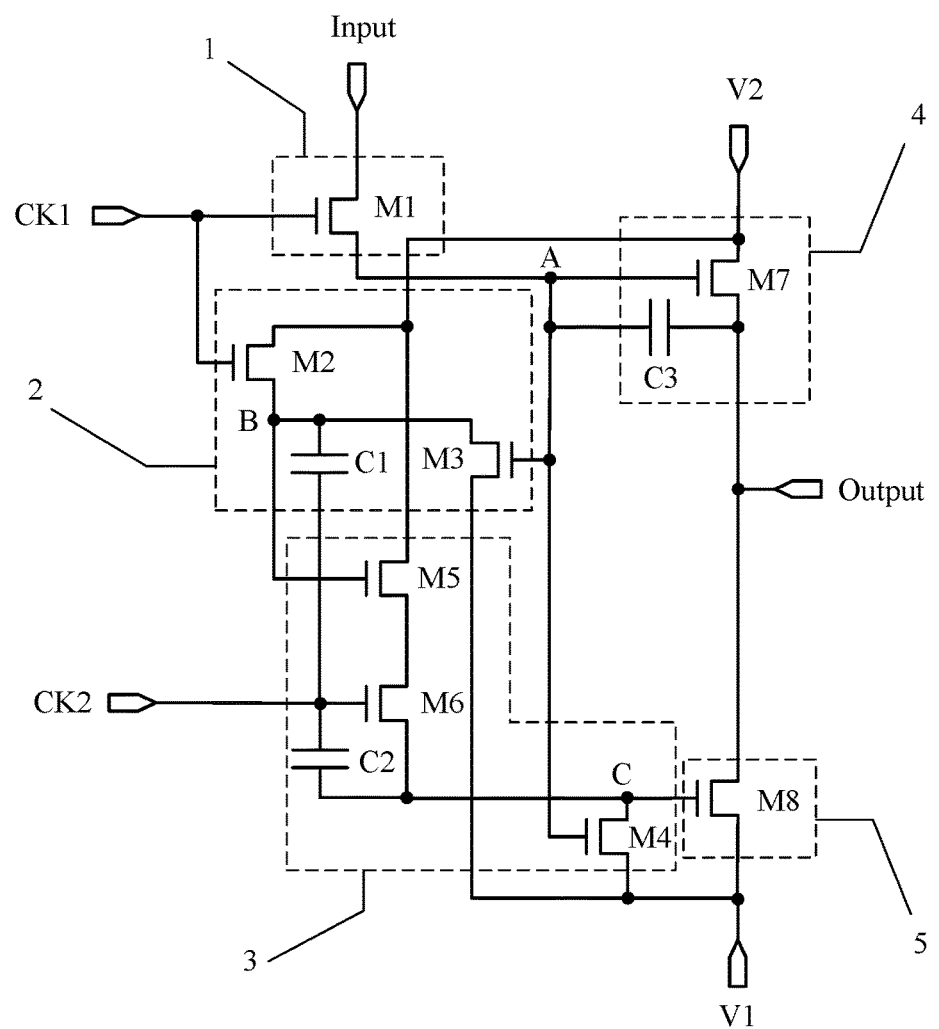
FIG. 2b is a schematic diagram of structure of the shift register provided by an embodiment of the present disclosure.

Further, as shown in FIG. 2a, in a case where an effective pulse signal of the input signal Input is a high potential, the first switching transistor M1 may be a P-type transistor. As shown in FIG. 2b, in a case where an effective pulse signal of the input signal Input is a low potential, the first switching transistor M1 may be an N-type transistor. As to the type of the switching transistor, and no limitations are made herein.

When the first switching transistor M1 is in a turned-on state under the control of the first clock signal CK1, the input signal Input is supplied to the first node A.

The above merely illustrates structure of the input module in the shift register by examples, structure of the input module is not limited to the aforesaid structure, it may be others, and no limitations are made herein.

Optionally, as shown in FIGS. 2a and 2b, the first control module 2 may comprise a second switching transistor M2, a third switching transistor M3, and a first capacitor C1.

A gate of the second switching transistor M2 is configured to receive the first clock signal CK1, a source of the second switching transistor M2 is configured to receive the second DC signal V2, and a drain of the second switching transistor M2 is connected to the second node B.

A gate of the third switching transistor M3 is connected to the first node A, a source of the third switching transistor M3 is configured to receive the first DC signal V1, and a drain of the third switching transistor M3 is connected to the second node B.

One terminal of the first capacitor C1 is configured to receive the second clock signal CK2, and the other terminal of the first capacitor C1 is connected to the second node B.

Further, as shown in FIG. 2a, in a case where an effective pulse signal of the input signal Input is a high potential, the second switching transistor M2 and the third switching transistor M3 may be a P-type transistor each. As shown in FIG. 2b, in a case where an effective pulse signal of the input signal Input is a low potential, the second switching transistor M2 and the third switching transistor M3 may be an N-type transistor each. As to the type of the switching transistors, and no limitations are made herein.

When the second switching transistor M2 is in a turned-on state under the control of the first clock signal CK1, the second DC signal V2 is supplied to the second node B. When the third switching transistor M3 is in a turned-on state under the control of the potential of the first node A, the second DC signal V2 is supplied to the second node B. When the second node B is in a floating state, in accordance with a bootstrap action of the first capacitor C1, a voltage difference between the drain of the second switching transistor M2 and the second node B maintains a voltage difference in a previous period.

The above merely illustrates structure of the first control module in the shift register by examples, structure of the first control module is not limited to the aforesaid structure, it may be others, and no limitations are made herein.

Optionally, as shown in FIGS. 2a and 2b, the second control module 3 may comprise a fourth switching transistor M4, a fifth switching transistor M5, a sixth switching transistor M6, and a second capacitor C2.

A gate of the fourth switching transistor M4 is connected to the first node A, a source of the fourth switching transistor M4 is configured to receive the first DC signal V1, and a drain of the fourth switching transistor M4 is connected to the third node C.

A gate of the fifth switching transistor M5 is connected to the second node B, a source of the fifth switching transistor M5 is configured to receive the second DC signal V2, and a drain of the fifth switching transistor M5 is connected to a source of the sixth switching transistor M6.

A gate of the sixth switching transistor M6 is configured to receive the second clock signal CK2, and a drain of the sixth switching transistor M6 is connected to the third node C.

One terminal of the second capacitor C2 is configured to receive the second clock signal CK2, and the other terminal of the second capacitor C2 is connected to the third node C.

As shown in FIG. 2a, in a case where an effective pulse signal of the input signal Input is a high potential, the fourth switching transistor M4, the fifth switching transistor M5 and the sixth switching transistor M6 may be a P-type transistor each. As shown in FIG. 2b, in a case where an effective pulse signal of the input signal Input is a low potential, the fourth switching transistor M4, the fifth switching transistor M5 and the sixth switching transistor M6 may be an N-type transistor each. As to the type of the switching transistors, and no limitations are made herein.

When the fourth switching transistor M4 is in a turned-on state under the control of the potential of the first node A, the first DC signal V1 is supplied to the third node C. When the fifth switching transistor M5 is in a turned-on state under the control of the potential of the second node B and the sixth switching transistor M6 is in a turned-on state under the control of the second clock signal CK2, the second DC signal V2 is supplied to the third node C. When the third node C is in a floating state, in accordance with a bootstrap action of the second capacitor C2, a voltage difference between the drain of the sixth switching transistor M6 and the third node C maintains a voltage difference in a previous period.

The above merely illustrates structure of the second control module in the shift register by examples, structure of the second control module is not limited to the aforesaid structure, it may be others, and no limitations are made herein.

Optionally, as shown in FIGS. 2a and 2b, the first output module 4 may comprise a seventh switching transistor M7 and a third capacitor C3.

A gate of the seventh switching transistor M7 is connected to the first node A, a source of the seventh switching transistor M7 is configured to receive the second DC signal V2, and a drain of the seventh switching transistor M7 is connected to the driving signal output terminal Output.

One terminal of the third capacitor C3 is connected to the first node A, and the other terminal of the third capacitor C3 is connected to the driving signal output terminal Output.

As shown in FIG. 2a, in a case where an effective pulse signal of the input signal Input is a high potential, the seventh switching transistor M7 may be a P-type transistor. As shown in FIG. 2b, in a case where an effective pulse signal of the input signal Input is a low potential, the seventh switching transistor M7 may be an N-type transistor. As to the type of the switching transistor, and no limitations are made herein.

When the seventh switching transistor M7 is in a turned-on state under the control of the potential of the first node A, the second DC signal V2 is supplied to the driving signal output terminal Output. When the first node A is in a floating state, in accordance with a bootstrap action of the third capacitor C3, a voltage difference between the first node A and the driving signal output terminal Output maintains a voltage difference in a previous period.

The above merely illustrates structure of the first output module in the shift register by examples, structure of the first output module is not limited to the aforesaid structure, it may be others, and no limitations are made herein.

Optionally, as shown in FIGS. 2a and 2b, the second output module 5 may comprise an eighth switching transistor M8, wherein a gate of the eighth switching transistor M8 is connected to the third node C, a source of the eighth switching transistor M8 is configured to receive the first DC signal V1, and a drain of the eighth switching transistor M8 is connected to the driving signal output terminal Output.

Further, as shown in FIG. 2a, in a case where an effective pulse signal of the input signal Input is a high potential, the eighth switching transistor M8 may be a P-type transistor. As shown in FIG. 2b, in a case where an effective pulse signal of the input signal Input is a low potential, the eighth switching transistor M8 may be an N-type transistor. As to the type of the switching transistor, and no limitations are made herein.

When the eighth switching transistor M8 is in a turned-on state under the control of the potential of the third node C, the first DC signal V1 is supplied to the driving signal output terminal Output;

The above merely illustrates structure of the second output module in the shift register by examples, structure of the second output module is not limited to the aforesaid structure, it may be others, and no limitations are made herein.

Optionally, in the shift register provided in the embodiments of the present disclosure, all the switching transistors may adopt transistors made from the same material, wherein in a case where an effective pulse signal of an input signal is a high potential, as shown in FIG. 2a, all the switching transistors may be P-type transistors, and a potential of the first DC signal may be a high potential, and a potential of the second DC signal may be a low potential, and in a case where an effective pulse signal of an input signal is a low potential, as shown in FIG. 2b, all the switching transistors may be N-type transistors, and a potential of the first DC signal may be a low potential, and a potential of the second DC signal may be a high potential. A P-type switching transistor is turned off under action of a high potential and is turned on under action of a low potential, while an N-type switching transistor is turned on under action of a high potential and is turned off under action of a low potential.

It should be noted that each of the switching transistors referred to in the above embodiments of the present disclosure may be a Thin Film Transistor, or a Metal Oxide Semiconductor (MOS), and no limitations are made herein. According to types of the transistors and different input signals, the functions of the source and the drain of these transistors may be interchanged, no differentiation is made herein.

Herein, operation process of the shift register provided by the embodiments of the present disclosure will be described in combination with a circuit timing diagram. In the following description, 1 represents a high potential signal, 0 represents a low potential signal.

First Embodiment

Operation process of the shift register is described with structure of the shift register shown in FIG. 2a as example. In the shift register shown in FIG. 2a, all the switching transistors are P-type switching transistors, each P-type switching transistor is turned off under action of a high potential, and is turned on under action of a low potential; the first clock signal CK1 and the second clock signal CK2 have the same cycle and the same duty ratio which are both greater than 0.5, a period when the first clock signal CK1 is in a low potential within one cycle resides between a period when the second clock signal is a high potential within one cycle; a potential of the first DC signal V1 is a high potential, and a potential of the second DC signal V2 is a low potential.

Figure 3A:
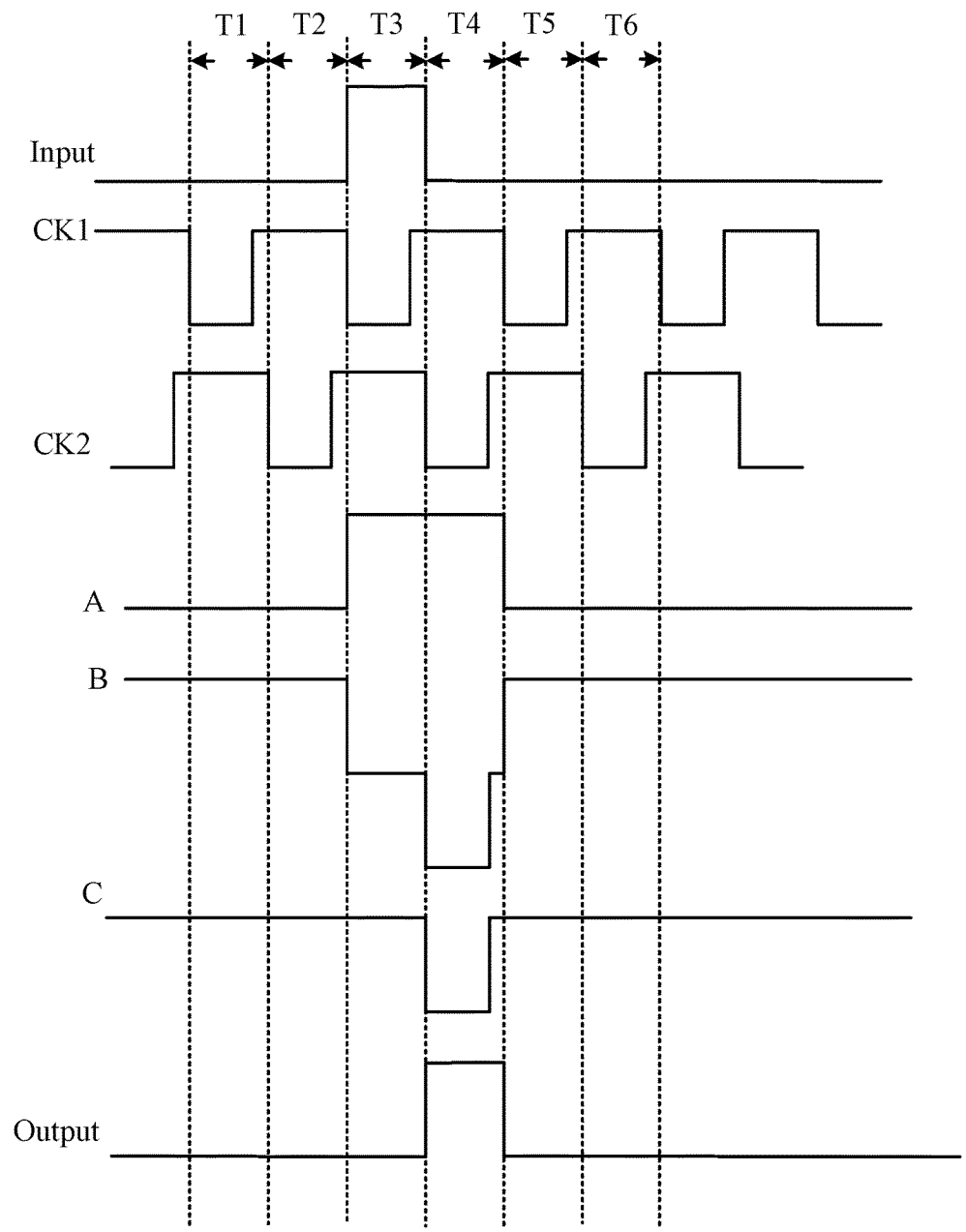

The corresponding input output timing diagram is as shown in FIG. 3a. Six phases T1, T2, T3, T4, T5, and T6 in the input output timing diagram shown in FIG. 3a are selected.

In the first half of the phase T1, CK1=0, CK2=1, Input=0. Since CK1=0, the first switching transistor M1 and the second switching transistor M2 both are turned on. Since the first switching transistor M1 is turned on and the input signal Input is supplied to the first node A, a potential of the first node A is a low potential. Since a potential of the first node A is a low potential, the third switching transistor M3, the fourth switching transistor M4, the seventh switching transistor M7 are all turned on, and the third capacitor C3 starts to charge. Since the second switching transistor M2 is turned on and potentials of the gate and the drain of the second switching transistor M2 are both low potentials, the second switching transistor M2 is in a saturated high-impedance state. Since the third switching transistor M3 is turned on and the first DC signal V1 of a high potential is supplied to the second node B, a potential of the second node B is a high potential, the first capacitor C1 starts to charge. Since a potential of the second node B is a high potential, the fifth switching transistor M5 is turned off. Since CK2=1, the sixth switching transistor M6 is turned off. Since the fourth switching transistor M4 is turned on and the first DC signal V1 of a high potential is supplied to the third node C, a potential of the third node C is a high potential, the second capacitor C2 starts to charge. Since a potential of the third node C is a high potential, the eighth switching transistor M8 is turned off. Since the seventh switching transistor M7 is turned on and the second DC signal V2 of a low potential is supplied to the driving signal output terminal Output, the driving signal output terminal Output outputs a low potential scanning signal.

In the latter half of the phase T1, CK1=1, CK2=1, Input=0. Since CK1=1, the first switching transistor M1 and the second switching transistor M2 are both turned off. Since the first switching transistor M1 is turned off, the first node A is in a floating state. Since the first node A is in a floating state, due to a bootstrap action of the third capacitor C3, thus, in order to maintain a voltage difference between two ends of the third capacitor C3, a potential of the first node A maintains a low potential in a previous period, so as to ensure that the third switching transistor M3, the fourth switching transistor M4 and the seventh switching transistor M7 are all turned on in this phase. Since the third switching transistor M3 is turned on and the first DC signal V1 of a high potential is supplied to the second node B, a potential of the second node B is a high potential. Since a potential of the second node B is a high potential, the fifth switching transistor M5 is turned off. Since CK2=1, the sixth switching transistor M6 is turned off. Since the fourth switching transistor M4 is turned on and the first DC signal V1 of a high potential is supplied to the third node C, a potential of the third node C is a high potential. Since a potential of the third node C is a high potential, the eighth switching transistor M8 is turned off. Since the seventh switching transistor M7 is turned on and the second DC signal V2 of a low potential is supplied to the driving signal output terminal Output, the driving signal output terminal Output outputs a low potential scanning signal.

In the first half of the phase T2, CK1=1, CK2=0, Input=0. Since CK1=1, the first switching transistor M1 and the second switching transistor M2 are both turned off. Since the first switching transistor M1 is turned off, the first node A is in a floating state. Since the first node A is in a floating state, due to a bootstrap action of the third capacitor C3, thus, in order to maintain a voltage difference between two ends of the third capacitor C3, a potential of the first node A maintains a low potential in a previous period, so as to ensure that the third switching transistor M3, the fourth switching transistor M4, and the seventh switching transistor M7 are all turned on in this phase. Since the third switching transistor M3 is turned on and the first DC signal V1 of a high potential is supplied to the second node B, a potential of the second node B is a high potential. Since a potential of the second node B is a high potential, the fifth switching transistor M5 is turned off. Since the fourth switching transistor M4 is turned on and the first DC signal V1 of a high potential is supplied to the third node C, a potential of the third node C is a high potential. Since a potential of the third node C is a high potential, the eighth switching transistor M8 is turned off. Since the seventh switching transistor M7 is turned on and the second DC signal V2 of a low potential is supplied to the driving signal output terminal Output, the driving signal output terminal Output outputs a low potential scanning signal.

In the latter half of the phase T2, CK1=1, CK2=1, Input=0. Since CK1=1, the first switching transistor M1 and the second switching transistor M2 are both turned off. Since the first switching transistor M1 is turned off, the first node A is in a floating state. Since the first node A is in a floating state, due to a bootstrap action of the third capacitor C3, thus, in order to maintain a voltage difference between two ends of the third capacitor C3, a potential of the first node A maintains a low potential in a previous period, so as to ensure that the third switching transistor M3, the fourth switching transistor M4, and the seventh switching transistor M7 are all turned on in this phase. Since the third switching transistor M3 is turned on and the first DC signal V1 of a high potential is supplied to the second node B, a potential of the second node B is a high potential. Since a potential of the second node B is a high potential, the fifth switching transistor M5 is turned off. Since the fourth switching transistor M4 is turned on and the first DC signal V1 of a high potential is supplied to the third node C, a potential of the third node C is a high potential, the second capacitor C2 starts to charge. Since a potential of the third node C is a high potential, the eighth switching transistor M8 is turned off. Since the seventh switching transistor M7 is turned on and the second DC signal V2 of a low potential is supplied to the driving signal output terminal Output, the driving signal output terminal Output outputs a low potential scanning signal.

In the first half of the phase T3, CK1=0, CK2=1, Input=1. Since CK1=0, the first switching transistor M1 and the second switching transistor M2 are both turned on. Since the first switching transistor M1 is turned on and the input signal Input is supplied to the first node A, a potential of the first node A is a high potential. Since a potential of the first node A is a high potential, the third switching transistor M3, the fourth switching transistor M4, and the seventh switching transistor M7 are all turned off, the third capacitor C3 starts to charge. Since the second switching transistor M2 is turned on and the second DC signal V2 of a low potential is supplied to the node B, a potential of the second node B is a low potential, the first capacitor C1 starts to charge. Since a potential of the second node B is a low potential, the fifth switching transistor is turned on. Since CK2=1, the sixth switching transistor M6 is turned off, the third node C is in a floating state. Since the third node C is in a floating state, due to a bootstrap action of the second capacitor C2, thus, in order to maintain a voltage difference between two ends of the second capacitor C2, a potential of the third node C maintains a high potential in a previous period to ensure that the eighth switching transistor M8 is turned off in this phase. Therefore, the driving signal output terminal Output maintains a low potential output state in a previous state through a capacitor on an output line of a display region.

In the latter half of the phase T3, CK1=1, CK2=1, Input=1. Since CK1=1, the first switching transistor M1 and the second switching transistor M2 are both turned off. Since the first switching transistor M1 is turned off, the first node A is in a floating state. Since the first node A is in a floating state, due to a bootstrap action of the third capacitor C3, thus, in order to maintain a voltage difference between two ends of the third capacitor C3, a potential of the first node A maintains a high potential in a previous period, so as to ensure that the third switching transistor M3, the fourth switching transistor M4, and the seventh switching transistor M7 are all turned off in this phase. Since the second switching transistor M2 and the third switching transistor M3 are both turned off, the second node B is in a floating state. Since the second node B is in a floating state, due to a bootstrap action of the first capacitor C1, thus, in order to maintain a voltage difference between two ends of the first capacitor C1, a potential of the second node B maintains a low potential in a previous period. Since a potential of the second node B is a low potential, the fifth switching transistor M5 is turned on. Since CK2=1, the sixth switching transistor M6 is turned off, the third node C is in a floating state. Since the third node C is in a floating state, due to a bootstrap action of the second capacitor C2, thus, in order to maintain a voltage difference between two ends of the second capacitor C2, a potential of the third node C maintains a high potential in a previous period, so as to ensure that the eighth switching transistor M8 is turned off in this phase; therefore, the driving signal output terminal Output maintains a low potential output state in a previous state through a capacitor on an output line of a display region.

In the first half of the phase T4, CK1=1, CK2=0, Input=0. Since CK1=1, the first switching transistor M1 and the second switching transistor M2 are both turned off. Since the first switching transistor M1 is turned off, the first node A is in a floating state. Since the first node A is in a floating state, due to a bootstrap action of the third capacitor C3, thus, in order to maintain a voltage difference between two ends of the third capacitor C3, a potential of the first node A maintains a high potential in a previous period, so as to ensure that the third switching transistor M3, the fourth switching transistor M4, and the seventh switching transistor M7 are all turned off in this phase. Since the second switching transistor M2 and the third switching transistor M3 are both turned off, the second node B is in a floating state. Since the second node B is in a floating state, due to a bootstrap action of the first capacitor C1, thus, in order to maintain a voltage difference between two ends of the first capacitor C1, a potential of the second node B is further pulled down, so as to ensure that the fifth switching transistor M5 is turned on in this phase. Since CK2=0, the sixth switching transistor M6 is turned on. Since the fifth switching transistor M5 and the sixth switching transistor M6 are both turned on and the second DC current V2 of a pulled-down potential is supplied to the third node C, a potential of the third node C is a low potential. Since a potential of the third node C is a low potential, the eighth switching transistor M8 is turned on, the second capacitor C2 starts to charge. Since the eighth switching transistor M8 is turned on and the first DC signal V1 of a high potential is supplied to the driving signal output terminal Output, the driving signal output terminal Output outputs a scanning signal of a high potential.

In the latter half of the phase T4, CK1=1, CK2=1, Input=0. Since CK1=1, the first switching transistor M1 and the second switching transistor M2 are both turned off. Since the first switching transistor M1 is turned on, the first node A is in a floating state. Since the first node A is in a floating state, due to a bootstrap action of the third capacitor C3, thus, in order to maintain a voltage difference between two ends of the third capacitor C3, a potential of the first node A maintains a high potential in a previous period, so as to ensure that the third switching transistor M3, the fourth switching transistor M4, and the seventh switching transistor M7 are all turned off in this phase. Since the second switching transistor M2 and the third switching transistor M3 are both turned off, the second node B is in a floating state. Since the second node B is in a floating state, due to a bootstrap action of the first capacitor C1, thus, in order to maintain a voltage difference between two ends of the first capacitor C1, a potential of the second node B is a low potential. Since a potential of the second node B is a low potential, the fifth switching transistor M5 is turned on. Since CK2=1, the sixth switching transistor M6 is turned off, the third node C is in a floating state. Since the third node C is in a floating state, duo to a bootstrap action of the second capacitor C2, thus, in order to maintain a voltage difference between two ends of the second capacitor C2, a potential of the third node C is a high potential, so as to ensure that the eighth switching transistor M8 is turned off in this phase. Therefore, the driving signal output terminal Output maintains a high potential output state in a previous state through a capacitor on an output line of a display region.

In the first half of the phase T5, CK1=0, CK2=1, Input=0. Since CK1=0, the first switching transistor M1 and the second switching transistor M2 are both turned on. Since the first switching transistor M1 is turned on and the input signal Input is supplied to the first node A, a potential of the first node A is a low potential. Since a potential of the first node A is a low potential, the third switching transistor M3, the fourth switching transistor M4, and the seventh switching transistor M7 are all turned on, the third capacitor C3 starts to charge. Since the second switching transistor M2 is turned on and potentials of the gate and the drain of the second switching transistor M2 are both low potentials, the second switching transistor M2 is in a saturated high-impedance state. Since the third switching transistor M3 is turned on and the first DC signal V1 of a high potential is supplied to the second node B, a potential of the second node B is a high potential, the first capacitor C1 starts to charge. Since a potential of the second node B is a high potential, the fifth switching transistor M5 is turned off. Since CK2=1, the sixth switching transistor M6 is turned off. Since the fourth switching transistor M4 is turned on and the first DC signal V1 of a high potential is supplied to the first node C, a potential of the third node C is a high potential, the second capacitor C2 starts to charge. Since a potential of the third node C is a high potential, the eighth switching transistor M8 is turned off. Since the seventh switching transistor M7 is turned on and the second DC signal V2 of a low potential is supplied to the driving signal output terminal Output, the driving signal output terminal Output outputs a scanning signal of a low potential.

In the latter half of the phase T5, CK1=1, CK2=1, Input=0. Since CK1=1, the first switching transistor M1 and the second switching transistor M2 are both turned off. Since the first switching transistor M1 is turned off, the first node A is in a floating state. Since the first node A is in a floating state, due to a bootstrap action of the third capacitor C3, thus, in order to maintain a voltage difference between two ends of the third capacitor C3, a potential of the first node A maintains a low potential in a previous period, so as to ensure that the third switching transistor M3, the fourth switching transistor M4, and the seventh switching transistor M7 are all turned on in this phase. Since the third switching transistor M3 is turned on and the first DC signal V1 of a high potential is supplied to the second node B, a potential of the second node B is a high potential, the fifth switching transistor M5 is turned off. Since CK2=1, the sixth switching transistor M6 is turned off. Since the fourth switching transistor M4 is turned on and the first DC signal V1 of a high potential is supplied to the third node C, a potential of the third node C is a high potential. Since a potential of the third node C is a high potential, the eighth transistor M8 is turned off. Since the seventh switching transistor M7 is turned on and the second DC signal V2 of a low potential is supplied to the driving signal output terminal Output, the driving signal output terminal Output outputs a scanning signal of a low potential.

In the first half of the phase T6, CK1=1, CK2=0, Input=0. Since CK1=1, the first switching transistor M1 and the second switching transistor M2 are both turned off. Since the first switching transistor M1 is turned off, the first node A is in a floating state. Since the first node A is in a floating state, due to a bootstrap action of the third capacitor C3, thus, in order to maintain a voltage difference between two ends of the third capacitor C3, a potential of the first node A maintains a low level in a previous period, so as to ensure that the third switching transistor M3, the fourth switching transistor M4, and the seventh switching transistor M7 are all turned on in this phase. Since the third switching transistor M3 is turned on and the first DC signal V1 of a high potential is supplied to the second node B, a potential of the second node B is a high potential. Since a potential of the second node is a high potential, the fifth switching transistor M5 is turned off. Since the fourth switching transistor M4 is turned on and the first DC signal V1 of a high potential is supplied to the third node C, a potential of the third node C is a high potential. Since a potential of the third node C is a high potential, the eighth switching transistor M8 is turned off. Since the seventh switching transistor M7 is turned on and the second DC signal V2 of a low potential is supplied to the driving signal output terminal Output, the driving signal output terminal Output outputs a scanning signal of a low potential.

In the latter half of the phase T6, CK1=1, CK2=1, Input=0. Since CK1=1, the first switching transistor M1 and the second switching transistor M2 are both turned off. Since the first switching transistor M1 is turned off, the first node A is in a floating state. Since the first node A is in a floating state, due to a bootstrap action of the third capacitor C3, thus, in order to maintain a voltage difference between two ends of the third capacitor C3, a potential of the first node A maintains a low potential in a previous period, so as to ensure that the third switching transistor M3, the fourth switching transistor M4, and the seventh switching transistor M7 are all turned on in this phase. Since the third switching transistor M3 is turned on and the first DC signal V1 of a high potential is supplied to the second node B, a potential of the second node B is a high potential. Since a potential of the second node B is a high potential, the fifth switching transistor M5 is turned off. Since the fourth switching transistor M4 is turned on and the first DC signal V1 of a high potential is supplied to the third node C, a potential of the third node C is a high potential, the second capacitor C2 starts to charge. Since a potential of the third node C is a high potential, the eighth switching transistor M8 is turned off. Since the seventh switching transistor M7 is turned on and the second DC signal V2 of a low potential is supplied to the driving signal output terminal Output, the driving signal output terminal Output outputs a low potential scanning signal.

After the phase T6, the phase T5 and the phase T6 will be repeated until the next frame starts.

Second Embodiment

Figure 3B:
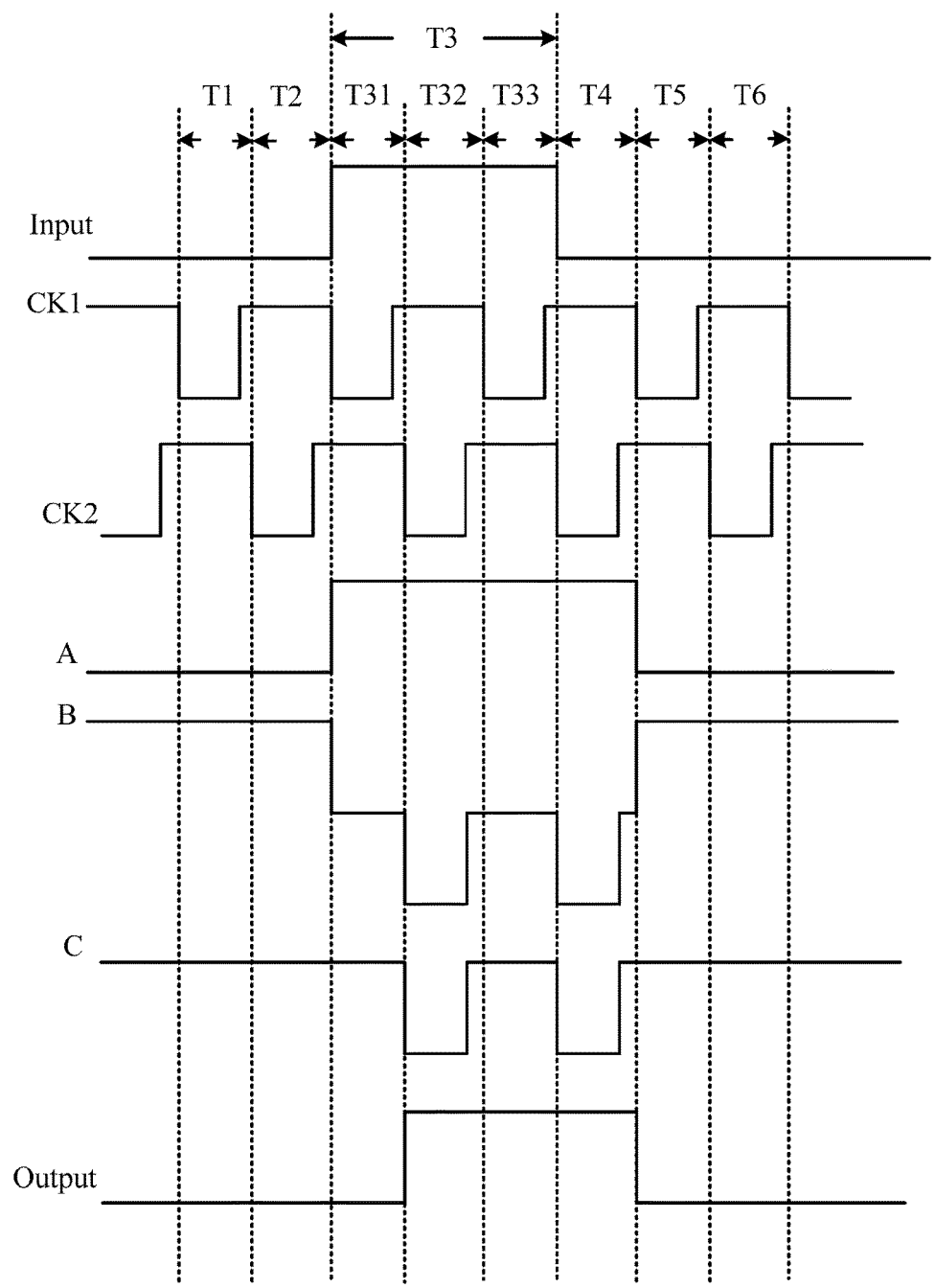

Operation process of the shift register is described with structure of the shift register shown in FIG. 2a as example. Based on the First Embodiment, when a time length of the effective pulse signal of the input signal is extended by one clock signal cycle, the corresponding input output timing diagram is as shown in FIG. 3b. Six phases of T1, T2, T3, T4, T5, and T6 in the input output timing diagram shown in FIG. 3b are selected, wherein the phase T3 is further divided into three phases T31, T32, and T33.

In the first half of the phase T1, CK1=0, CK2=1, Input=0. In the latter half of the phase T1, CK1=1, CK2=1, Input=0. Operation process in this phase is the same as that in the phase T1 of the First Embodiment, and no more details are repeated herein.

In the first half of the phase T2, CK1=1, CK2=0, Input=0. In the latter half of the phase T2, CK1=1, CK2=1, Input=0. Operation process in this phase is the same as that in the phase T2 of the First Embodiment, and no more details are repeated herein.

In the first half of the phase T31, CK1=0, CK2=1, Input=1. Since CK1=0, the first switching transistor M1 and the second switching transistor M2 are both turned on. Since the first switching transistor M1 is turned on and the input signal Input is supplied to the first node A, a potential of the first node A is a high potential. Since a potential of the first node A is a high potential, the third switching transistor M3, the fourth switching transistor M4, and the seventh switching transistor M7 are all turned off, the third capacitor C3 starts to charge. Since the second switching transistor M2 is turned on and the second DC signal V2 of a low potential is supplied to the node B, a potential of the second node B is a low potential, the first capacitor C1 starts to charge. Since a potential of the second node B is a low potential, the fifth switching transistor M5 is turned on. Since CK2=1, the sixth switching transistor M6 is turned off, the third node C is in a floating state. Since the third node C is in a floating state, due to a bootstrap action of the second capacitor C2, thus, in order to maintain a voltage difference between two ends of the second capacitor C2, a potential of the third node C maintains a high potential in a previous period to ensure that the eighth switching transistor M8 is turned off in this phase. Therefore, the driving signal output terminal Output maintains a low potential output state in a previous state through a capacitor on an output line of a display region.

In the latter half of the phase T31, CK1=1, CK2=1, Input=1. Since CK1=1, the first switching transistor M1 and the second switching transistor M2 are both turned off. Since the first switching transistor M1 is turned off, the first node A is in a floating state. Since the first node A is in the floating state, due to a bootstrap action of the third capacitor C3, thus, in order to maintain a voltage difference between two ends of the third capacitor C3, a potential of the first node A maintains a high potential in a previous period, so as to ensure that the third switching transistor M3, the fourth switching transistor M4, and the seventh switching transistor M7 are all turned off in this phase. Since the second switching transistor M2 and the third switching transistor M3 are both turned off, the second node B is in a floating state. Since the second node B is in a floating state, due to a bootstrap action of the first capacitor C1, thus, in order to maintain a voltage difference between two ends of the first capacitor C1, a potential of the second node B maintains a low potential in a previous period. Since a potential of the second node B is a low potential, the fifth switching transistor M5 is turned on. Since CK2=1, the sixth switching transistor M6 is turned off, the third node C is in a floating state. Since the third node C is in a floating state, due to a bootstrap action of the second capacitor C2, thus, in order to maintain a voltage difference between two ends of the second capacitor C2, a potential of the third node C maintains a high potential in a previous period, so as to ensure that the eighth switching transistor M8 is turned off in this phase. Therefore, the driving signal output terminal Output maintains a low potential output state in a previous state through a capacitor on an output line of a display region.

In the first half of the phase T32, CK1=1, CK2=0, Input=1. Since CK1=1, the first switching transistor M1 and the second switching transistor M2 are both turned off. Since the first switching transistor M1 is turned off, the first node A is in a floating state. Since the first node A is in a floating state, due to a bootstrap action of the third capacitor C3, thus, in order to maintain a voltage difference between two ends of the third capacitor C3, a potential of the first node A maintains a high potential in a previous period, so as to ensure that the third switching transistor M3, the fourth switching transistor M4, and the seventh switching transistor M7 are all turned off in this phase. Since the second switching transistor M2 and the third switching transistor M3 are both turned off, the second node B is in a floating state. Since the second node B is in a floating state, due to a bootstrap action of the first capacitor C1, thus, in order to maintain a voltage difference between two ends of the first capacitor C1, a potential of the second node B is further pulled down, so as to ensure that the fifth switching transistor M5 is turned on in this stage. Since CK2=0, the sixth switching transistor M6 is turned on. Since the fifth switching transistor M5 and the sixth switching transistor M6 are both turned on and the second DC current V2 of a pulled-down potential is supplied to the third node C, a potential of the third node C is a low potential. Since a potential of the third node C is a low potential, the eighth switching transistor M8 is turned on, the second capacitor C2 starts to charge. Since the eighth switching transistor M8 is turned on and the first DC signal V1 of a high potential is supplied to the driving signal output terminal Output, the driving signal output terminal Output outputs a scanning signal of a high potential.

In the latter half of the phase T32, CK1=1, CK2=1, Input=1. Since CK1=1, the first switching transistor M1 and the second switching transistor M2 are both turned off. Since the first switching transistor M1 is turned off, the first node A is in a floating state. Since the first node A is in the floating state, due to a bootstrap action of the third capacitor C3, thus, in order to maintain a voltage difference between two ends of the third capacitor C3, a potential of the first node A maintains a high potential in a previous period, so as to ensure that the third switching transistor M3, the fourth switching transistor M4, and the seventh switching transistor M7 are all turned off in this phase. Since the second switching transistor M2 and the third switching transistor M3 are both turned off, the second node B is in a floating state. Since the second node B is in a floating state, due to a bootstrap action of the first capacitor C1, thus, in order to maintain a voltage difference between two ends of the first capacitor C1, a potential of the second node B is a low potential. Since a potential of the second node B is a low potential, the fifth switching transistor M5 is turned on. Since CK2=1, the sixth switching transistor is turned off, the third node C is in a floating state. Since the third node C is in a floating state, due to a bootstrap action of the second capacitor C2, thus, in order to maintain a voltage difference between two ends of the second capacitor C2, a potential of the third node C is a high potential, so as to ensure that the eighth switching transistor M8 is turned off in this phase; therefore, the driving signal output terminal Output maintains a high potential output state in a previous state through a capacitor on an output line of a display region.

In the first half of the phase T33, CK1=0, CK2=1, Input=1. Since CK1=0, the first switching transistor M1 and the second switching transistor M2 are both turned on. Since the first switching transistor M1 is turned on and the input signal Input is supplied to the first node A, a potential of the first node A is a high potential. Since a potential of the first node A is a high potential, the third switching transistor M3, the fourth switching transistor M4, and the seventh switching transistor M7 are all turned off, the third capacitor C3 starts to charge. Since the second switching transistor M2 is turned on and the second DC signal V2 of a low potential is supplied to the node B, a potential of the second node B is a low potential, the first capacitor C1 starts to charge. Since a potential of the second node B is a low potential, the fifth switching transistor M5 is turned on. Since CK2=1, the sixth switching transistor M6 is turned off, the third node C is in a floating state. Since the third node C is in a floating state, due to a bootstrap action of the second capacitor C2, thus, in order to maintain a voltage difference between two ends of the second capacitor C2, a potential of the third node C maintains a high potential in a previous period to ensure that the eighth switching transistor M8 is turned off in this phase; therefore, the driving signal output terminal Output maintains a high potential output state in a previous state through a capacitor on an output line of a display region.

In the latter half of the phase T33, CK1=1, CK2=1, Input=1. Since CK1=1, the first switching transistor M1 and the second switching transistor M2 are both turned off. Since the first switching transistor M1 is turned off, the first node A is in a floating state. Since the first node A is in a floating state, due to a bootstrap action of the third capacitor C3, thus, in order to maintain a voltage difference between two ends of the third capacitor C3, a potential of the first node A maintains a high potential in a previous period, so as to ensure that the third switching transistor M3, the fourth switching transistor M4, and the seventh switching transistor M7 are all turned off in this phase. Since the second switching transistor M2 and the third switching transistor M3 are both turned off, the second node B is in a floating state. Since the second node B is in a floating state, due to a bootstrap action of the first capacitor C1, thus, in order to maintain a voltage difference between two ends of the first capacitor C1, a potential of the second node B maintains a low potential in a previous period. Since a potential of the second node B is a low potential, the fifth switching transistor M5 is turned on. Since CK2=1, the sixth switching transistor M6 is turned off, the third node C is in a floating state. Since the third node C is in a floating state, due to a bootstrap action of the second capacitor C2, thus, in order to maintain a voltage difference between two ends of the second capacitor C2, a potential of the third node C maintains a high potential in a previous period, so as to ensure that the eighth switching transistor M8 is turned off in this phase; therefore, the driving signal output terminal Output maintains a low potential output state in a previous state through a capacitor on an output line of a display region.

In the first half of the phase T4, CK1=1, CK2=0, Input=0. In the latter half of the phase T4, CK1=1, CK2=1, Input=0. Operation process in this phase is the same as that in the phase T4 in the First Embodiment, no details are repeated herein.

In the first half of the phase T5, CK1=0, CK2=1, Input=0. In the latter half of the phase T5, CK1=1, CK2=1, Input=0. Operation process in this phase is the same as that in the phase T5 in the First Embodiment, no details are repeated herein.

In the first half of the phase T6, CK1=1, CK2=0, Input=0. In the latter half of the phase T6, CK1=1, CK2=1, Input=0. Operation process in this phase is the same as that in the phase T6 in the First Embodiment, no details are repeated herein.

After the phase T6, the phase T5 and the phase T6 will be repeated until the next frame starts.

Third Embodiment

Figure 3C:
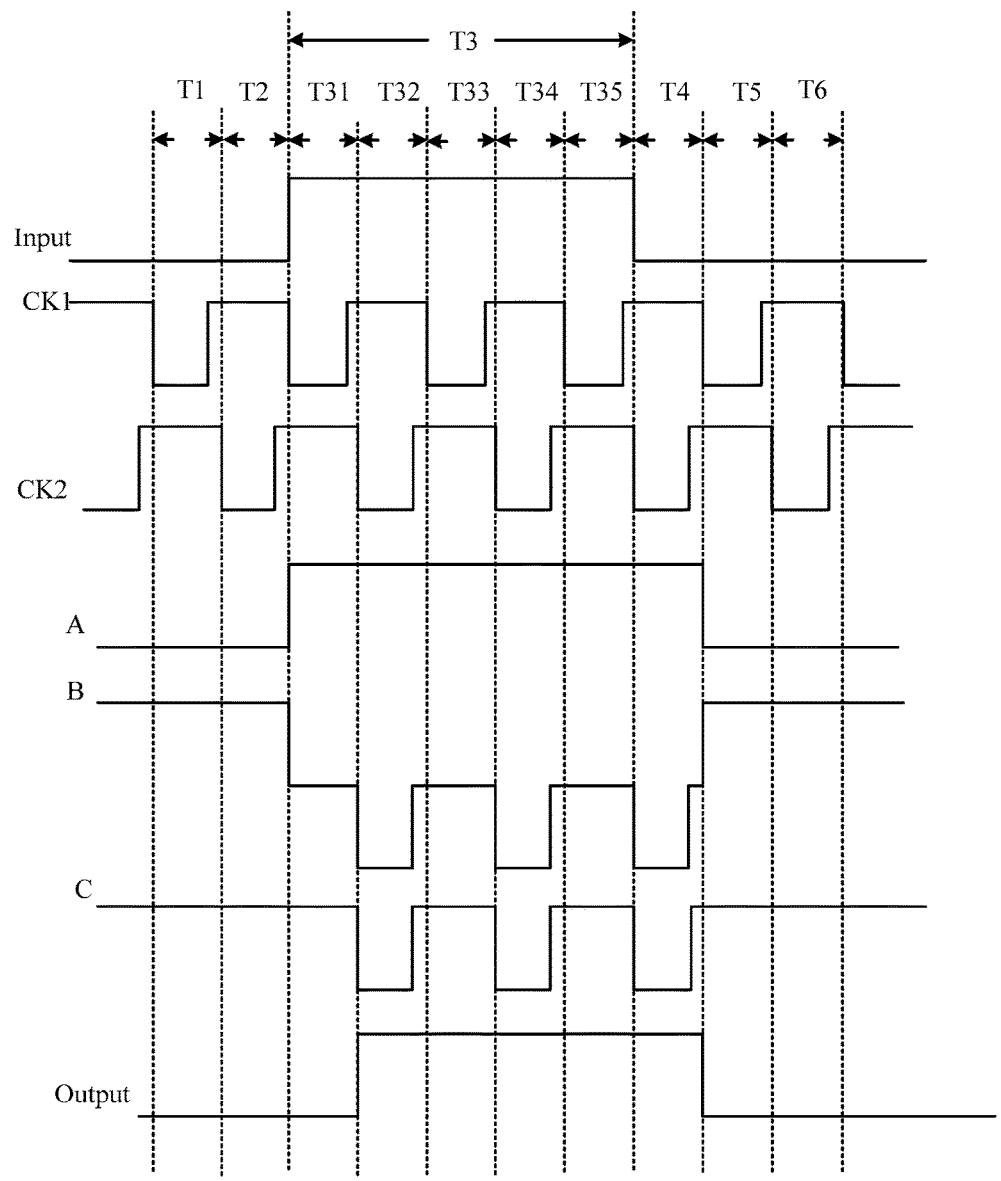

Operation process of the shift register is described with structure of the shift register shown in FIG. 2a as example. Based on the Second Embodiment, when a time length of the effective pulse signal of the input signal is extended by one clock signal cycle, the corresponding input output timing diagram is as shown in FIG. 3c. Sixth phases of T1, T2, T3, T4, T5, and T6 in the input output timing diagram shown in FIG. 3c are selected, wherein the phase T3 is further divided into five phases T31, T32, T33, T34 and T35.

In the first half of the phase T1, CK1=0, CK2=1, Input=0. In the latter half of the phase T1, CK1=1, CK2=1, Input=0. Operation process in this phase is the same as that in the phase T1 of the First Embodiment, and no more details are repeated herein.

In the first half of the phase T2, CK1=1, CK2=0, Input=0. In the latter half of the phase T2, CK1=1, CK2=1, Input=0. Operation process in this phase is the same as that in the phase T2 of the First Embodiment, and no more details are repeated herein.

In the first half of the phase T31, CK1=0, CK2=1, Input=1. In the latter half of the phase T31, CK1=1, CK2=1, Input=1. Operation process in this phase is the same as that in the phase T31 of T3 of the Second Embodiment, and no more details are repeated herein.

In the first half of the phase T32, CK1=1, CK2=0, Input=1. In the latter half of the phase T32, CK1=1, CK2=1, Input=1. Operation process in this phase is the same as that in the phase T32 of T3 of the Second Embodiment, and no more details are repeated herein.

In the first half of the phase T33, CK1=0, CK2=1, Input=1. Since CK1=0, the first switching transistor M1 and the second switching transistor M2 are both turned on. Since the first switching transistor M1 is turned on and the input signal Input is supplied to the first node A, a potential of the first node A is a high potential. Since a potential of the first node A is a high potential, the third switching transistor M3, the fourth switching transistor M4, and the seventh switching transistor M7 are all turned off, the third capacitor C3 starts to charge. Since the second switching transistor M2 is turned on and the second DC signal V2 of a low potential is supplied to the node B, a potential of the second node B is a low potential, the first capacitor C1 starts to charge. Since a potential of the second node B is a low potential, the fifth switching transistor M5 is turned on. Since CK2=1, the sixth switching transistor M6 is turned off, the third node C is in a floating state. Since the third node C is in a floating state, due to a bootstrap action of the second capacitor C2, thus, in order to maintain a voltage difference between two ends of the second capacitor C2, a potential of the third node C maintains a high potential in a previous period to ensure that the eighth switching transistor M8 is turned off in this phase; therefore, the driving signal output terminal Output maintains a low potential output state in a previous state through a capacitor on an output line of a display region.

In the latter half of the phase T33, CK1=1, CK2=1, Input=1. Since CK1=1, the first switching transistor M1 and the second switching transistor M2 are both turned off. Since the first switching transistor M1 is turned off, the first node A is in a floating state. Since the first node A is in the floating state, due to a bootstrap action of the third capacitor C3, thus, in order to maintain a voltage difference between two ends of the third capacitor C3, a potential of the first node A maintains a high potential in a previous period, so as to ensure that the third switching transistor M3, the fourth switching transistor M4, and the seventh switching transistor M7 are all turned off in this phase. Since the second switching transistor M2 and the third switching transistor M3 are both turned off, the second node B is in a floating state. Since the second node B is in a floating state, due to a bootstrap action of the first capacitor C1, thus, in order to maintain a voltage difference between two ends of the first capacitor C1, a potential of the second node B maintains a low potential in a previous period. Since a potential of the second node B is a low potential, the fifth switching transistor M5 is turned on. Since CK2=1, the sixth switching transistor M6 is turned off, the third node C is in a floating state. Since the third node C is in a floating state, due to a bootstrap action of the second capacitor C2, thus, in order to maintain a voltage difference between two ends of the second capacitor C2, a potential of the third node C maintains a high potential in a previous period, so as to ensure that the eighth switching transistor M8 is turned off in this phase; therefore, the driving signal output terminal Output maintains a low potential output state in a previous state through a capacitor on an output line of a display region. Operation process of the phase T33 is the same as that of T31.

In the first half of the phase T34, CK1=1, CK2=0, Input=1. Since CK1=1, the first switching transistor M1 and the second switching transistor M2 are both turned off. Since the first switching transistor M1 is turned off, the first node A is in a floating state. Since the first node A is in a floating state, due to a bootstrap action of the third capacitor C3, thus, in order to maintain a voltage difference between two ends of the third capacitor C3, a potential of the first node A maintains a high potential in a previous period, so as to ensure that the third switching transistor M3, the fourth switching transistor M4, and the seventh switching transistor M7 are all turned off in this phase. Since the second switching transistor M2 and the third switching transistor M3 are both turned off, the second node B is in a floating state. Since the second node B is in a floating state, due to a bootstrap action of the first capacitor C1, thus, in order to maintain a voltage difference between two ends of the first capacitor C1, a potential of the second node B is further pulled down, so as to ensure that the fifth switching transistor M5 is turned on in this stage. Since CK2=0, the sixth switching transistor M6 is turned on. Since the fifth switching transistor M5 and the sixth switching transistor M6 are both turned on and the second DC current V2 of a pulled-down potential is supplied to the third node C, a potential of the third node C is a low potential. Since a potential of the third node C is a low potential, the eighth switching transistor M8 is turned on, the second capacitor C2 starts to charge. Since the eighth switching transistor M8 is turned on and the first DC signal V1 of a high potential is supplied to the driving signal output terminal, the driving signal output terminal Output outputs a scanning signal of a high potential.

In the latter half of the phase T34, CK1=1, CK2=1, Input=1. Since CK1=1, the first switching transistor M1 and the second switching transistor M2 are both turned off. Since the first switching transistor M1 is turned off, the first node A is in a floating state. Since the first node A is in the floating state, due to a bootstrap action of the third capacitor C3, thus, in order to maintain a voltage difference between two ends of the third capacitor C3, a potential of the first node A maintains a high potential in a previous period, so as to ensure that the third switching transistor M3, the fourth switching transistor M4, and the seventh switching transistor M7 are all turned off. Since the second switching transistor M2 and the third switching transistor M3 are both turned off, the second node B is in a floating state. Since the second node B is in a floating state, due to a bootstrap action of the first capacitor C1, thus, in order to maintain a voltage difference between two ends of the first capacitor C1, a potential of the second node B is a low potential. Since a potential of the second node B is a low potential, the fifth switching transistor M5 is turned on. Since CK2=1, the sixth switching transistor M6 is turned off, the third node C is in a floating state. Since the third node C is in a floating state, due to a bootstrap action of the second capacitor C2, thus, in order to maintain a voltage difference between two ends of the second capacitor C2, a potential of the second node C2 is a high potential, so as to ensure that the eighth switching transistor M8 is turned off in this phase; therefore, the driving signal output terminal Output maintains a high potential output state in a previous state through a capacitor on an output line of a display region. Operation process of the phase T34 is the same as that of T32.

In the first half of the phase T35, CK1=0, CK2=1, Input=1. Since CK1=0, the first switching transistor M1 and the second switching transistor M2 are both turned on. Since the first switching transistor M1 is turned on and the input signal Input is supplied to the first node A, a potential of the first node A is a high potential. Since a potential of the first node A is a high potential, the third switching transistor M3, the fourth switching transistor M4, and the seventh switching transistor M7 are all turned off, the third capacitor C3 starts to charge. Since the second switching transistor M2 is turned on and the second DC signal V2 of a low potential is supplied to the node B, a potential of the second node B is a low potential, the first capacitor C1 starts to charge. Since a potential of the second node B is a low potential, the fifth switching transistor M5 is turned on. Since CK2=1, the sixth switching transistor M6 is turned off, the third node C is in a floating state. Since the third node C is in a floating state, due to a bootstrap action of the second capacitor C2, thus, in order to maintain a voltage difference between two ends of the second capacitor C2, a potential of the third node C maintains a high potential in a previous period to ensure that the eighth switching transistor M8 is turned off in this phase; therefore, the driving signal output terminal Output maintains a high potential output state in a previous state through a capacitor on an output line of a display region.

In the latter half of the phase T35, CK1=1, CK2=1, Input=1. Since CK1=1, the first switching transistor M1 and the second switching transistor M2 are both turned off. Since the first switching transistor M1 is turned off, the first node A is in a floating state. Since the first node A is in the floating state, due to a bootstrap action of the third capacitor C3, thus, in order to maintain a voltage difference between two ends of the third capacitor C3, a potential of the first node A maintains a high potential in a previous period, so as to ensure that the third switching transistor M3, the fourth switching transistor M4, and the seventh switching transistor M7 are all turned off in this phase. Since the second switching transistor M2 and the third switching transistor M3 are both turned off, the second node B is in a floating state. Since the second node B is in a floating state, due to a bootstrap action of the first capacitor C1, thus, in order to maintain a voltage difference between two ends of the first capacitor C1, a potential of the second node B maintains a low potential in a previous period. Since a potential of the second node B is a low potential, the fifth switching transistor M5 is turned on. Since CK2=1, the sixth switching transistor M6 is turned off, the third node C is in a floating state. Since the third node C is in a floating state, due to a bootstrap action of the second capacitor C2, thus, in order to maintain a voltage difference between two ends of the second capacitor C2, a potential of the third node C maintains a high potential in a previous period, so as to ensure that the eighth switching transistor M8 is turned off in this phase; therefore, the driving signal output terminal Output maintains a low potential output state in a previous state through a capacitor on an output line of a display region. Operation process of the phase T35 is the same as that of T33.

In the first half of the phase T4, CK1=1, CK2=0, Input=0. In the latter half of the phase T4, CK1=1, CK2=1, Input=0. Operation process in this phase is the same as that in the phase T4 in the First Embodiment, and no more details are repeated herein.

In the first half of T5 phase the, CK1=0, CK2=1, Input=0. In the latter half of the phase T5, CK1=1, CK2=1, Input=0. Operation process in this phase is the same as that in the phase T5 in the First Embodiment, and no more details are repeated herein.

In the first half of the phase T6, CK1=1, CK2=0, Input=0. In the latter half of the phase T6, CK1=1, CK2=1, Input=0. Operation process in this phase is the same as that in the phase T6 in the First Embodiment, and no more details are repeated herein.

After the phase T6, the phase T5 and the phase T6 will be repeated until the next frame starts.

The shift register provided in the embodiment of the present disclosure can, based on the input signal in the First Embodiment, output the scanning signal of the corresponding time length in the Second Embodiment by extending a time length of the effective pulse signal of the input signal by one clock signal cycle, and output the scanning signal of the corresponding time length in the Third Embodiment by extending a time length of the effective pulse signal of the input signal by two clock signal cycles, and so on. And thus, it is possible to achieve a scanning signal with a time length the same as that of the effective pulse signal of the input signal by means of extending the time length of the effective pulse signal.

Thus, the shift register provided by the present disclosure can control a time length of the scanning signal outputted from the driving signal output terminal only by changing a time length of the input signal without changing the clock signal or the circuit or the manufacturing process. Therefore, the shift register provided by the present disclosure can reduce difficulty of the gate driving circuit and complexity of the manufacturing process as well as the cost, as compared with the manner of using a plurality of types of clock control signals to control a time length of the scanning signal outputted from the driving signal output terminal.

Fourth Embodiment

Operation process of the shift register is described with structure of the shift register shown in FIG. 2b as example. In the shift register shown in FIG. 2b, all the switching transistors are N-type switching transistors, each N-type switching transistor is turned on under action of a high potential, and is turned off under action of a low potential; the first clock signal CK1 and the second clock signal CK2 have the same cycle, and the same duty ratio, which are both smaller than 0.5, a period when the first clock signal CK1 is in a high potential within one cycle resides between a period when the second clock signal is a low potential within one cycle. A potential of the first DC signal V1 is a low potential, a potential of the second DC signal V2 is a high potential.

Figure 4A:
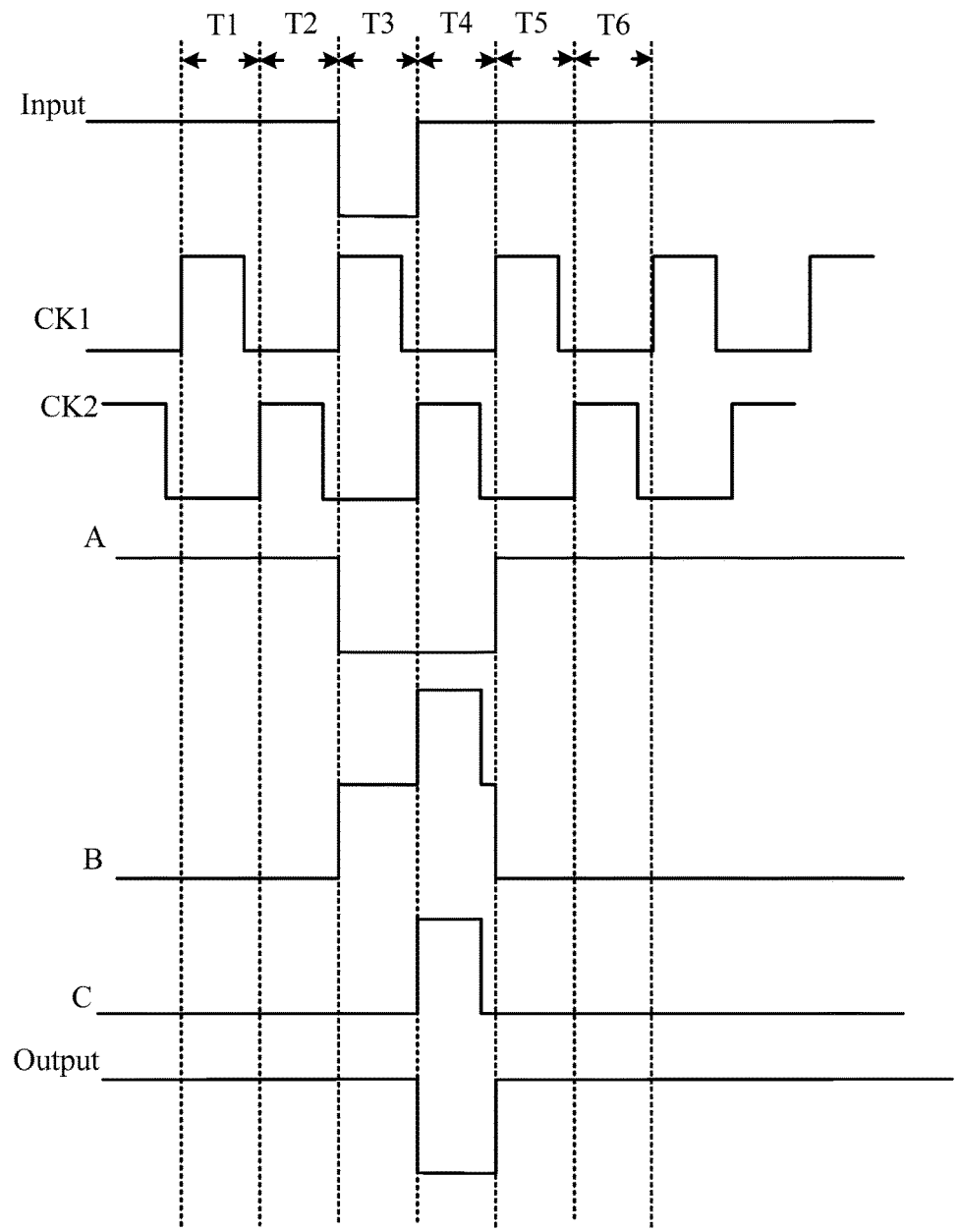
FIGS. 4a to 4c are circuit timing diagrams of the shift register shown in FIG. 2b.

The corresponding input output timing diagram is as shown in FIG. 4a. Six phases T1, T2, T3, T4, T5, and T6 in the input output timing diagram shown in FIG. 4a are selected.

In the first half of the phase T1, CK1=1, CK2=0, Input=1. Since CK1=1, the first switching transistor M1 and the second switching transistor M2 are both turned on. Since the first switching transistor M1 is turned on and the input signal Input is supplied to the first node A, a potential of the first node A is a high potential. Since a potential of the first node A is a high potential, the third switching transistor M3, the fourth switching transistor M4, and the seventh switching transistor M7 are all turned on, the third capacitor C3 starts to charge. Since the second switching transistor M2 is turned on and potentials of the gate and the drain of the second switching transistor M2 are both high potentials, the second switching transistor M2 is in a saturated high-impedance state. Since the third switching transistor M3 is turned on and the first DC signal V1 of a low potential is supplied to the second node B, a potential of the second node B is a low potential, the first capacitor C1 starts to charge. Since a potential of the second node B is low potential, the fifth switching transistor M5 is turned off. Since CK2=0, the sixth switching transistor M6 is turned off. Since the fourth switching transistor M4 is turned on and the first DC signal V1 of a low potential is supplied to the third node C, a potential of the third node C is a low potential, the second capacitor C2 starts to charge. Since a potential of the third node C is a low potential, the eighth switching transistor M8 is turned off. Since the seventh switching transistor M7 is turned on and the second DC signal V2 of a high potential is supplied to the driving signal output terminal Output, the driving signal output terminal Output outputs a scanning signal of a high potential.

In the latter half of the phase T1, CK1=0, CK2=0, Input=1. Since CK1=0, the first switching transistor M1 and the second switching transistor M2 are both turned off. Since the since the first switching transistor M1 is turned off, the first node A is in a floating state. Since the first node A is in a floating state, due to a bootstrap action of the third capacitor C3, thus, in order to maintain a voltage difference between two ends of the third capacitor C3, a potential of the first node A maintains a high level in a previous period, so as to ensure that the third switching transistor M3, the fourth switching transistor M3, the switching transistor M4, and the seventh switching transistor M7 are all turned on in this phase. Since the third switching transistor M3 is turned on and the first DC signal V1 of a low potential is supplied to the second node B, a potential of the second node B is a low potential. Since a potential of the second node B is a low potential, the fifth switching transistor M5 is turned off. Since CK2=0, the sixth switching transistor M6 is turned off. Since the fourth switching transistor M4 is turned on and the first DC signal V1 of a low potential is supplied to the third node C, a potential of the third node C is a low potential. Since a potential of the third node C is a low potential, the eighth switching transistor M8 is turned off. Since the seventh switching transistor M7 is turned on and the second DC signal V2 of a high potential is supplied to the driving signal output terminal Output, the driving signal output terminal Output outputs a scanning signal of a high potential.

In the first half of the phase T2, CK1=0, CK2=1, Input=1. Since CK1=0, Since CK1=1, the first switching transistor M1 and the second switching transistor M2 are both turned off. Since the first switching transistor M1 is turned off, the first node A is in a floating state. Since the first node A is in a floating state, due to a bootstrap action of the third capacitor C3, thus, in order to maintain a voltage difference between two ends of the third capacitor C3, a potential of the first node A maintains a high potential in a previous period, so as to ensure that the third switching transistor M3, the fourth switching transistor M4, and the seventh switching transistor M7 are all turned on in this phase. Since the third switching transistor M3 is turned on and the first DC signal V1 of a low potential is supplied to the second node B, a potential of the second node B is a low potential. Since a potential of the second node B is a low potential, the fifth switching transistor M5 is turned off. Since the fourth switching transistor M4 is turned on and the first DC signal V1 of a low potential is supplied to the third node C, a potential of the third node C is a low potential. Since a potential of the third node C is a low potential, the eighth transistor M8 is turned off. Since the seventh transistor M7 is turned on and the second DC signal V2 of a high potential is supplied to the driving signal output terminal Output, the driving signal output terminal Output outputs a scanning signal of a high potential.

In the latter half of the phase T2, CK1=0, CK2=0, Input=1. Since CK1=0, the first switching transistor M1 and the second switching transistor M2 are both turned off. Since the first switching transistor M1 is turned off, the first node A is in a floating state. Since the first node A is in the floating state, due to a bootstrap action of the third capacitor C3, thus, in order to maintain a voltage difference between two ends of the third capacitor C3, a potential of the first node A maintains a high potential in a previous period, so as to ensure that the third switching transistor M3, the fourth switching transistor M4, and the seventh switching transistor M7 are all turned on in this phase. Since the third switching transistor M3 is turned on and the first DC signal V1 of a low potential is supplied to the second node B, a potential of the second node B is a low potential. Since a potential of the second node B is a low potential, the fifth switching transistor M5 is turned off. Since the fourth switching transistor M4 is turned on and the first DC signal V1 of a low potential is supplied to the third node C, a potential of the third node C is a low potential. Since a potential of the third node C is a low potential, the eighth transistor M8 is turned off. Since the seventh switching transistor M7 is turned on and the second DC signal V2 of a high potential is supplied to the driving signal output terminal Output, the driving signal output terminal Output outputs a scanning signal of a high potential.

In the first half of the phase T3, CK1=1, CK2=0, Input=0. Since CK1=1, the first switching transistor M1 and the second switching transistor M2 are both turned on. Since the first switching transistor M1 is turned on and the input signal Input is supplied to the first node A, a potential of the first node A is a low potential. Since a potential of the first node A is a low potential, the third switching transistor M3, the fourth switching transistor M4, and the seventh switching transistor M7 are all turned off, the third capacitor C3 starts to charge. Since the second switching transistor M2 is turned on and the second DC signal V2 of a high potential is supplied to the node B, a potential of the second node B is a high potential, the first capacitor C1 starts to charge. Since a potential of the second node B is a high potential, the fifth switching transistor is turned on. Since CK2=0, the sixth switching transistor M6 is turned off, the third node C is in a floating state. Since the third node C is in a floating state, due to a bootstrap action of the second capacitor C2, thus, in order to maintain a voltage difference between two ends of the second capacitor C2, a potential of the third node C maintains a low potential in a previous period to ensure that the eighth switching transistor M8 is turned off in this phase; therefore, the driving signal output terminal Output maintains a high potential output state in a previous state through a capacitor on an output line of a display region.

In the latter half of the phase T3, CK1=0, CK2=0, Input=0. Since CK1=0, the first switching transistor M1 and the second switching transistor M2 are both turned off. Since the first switching transistor M1 is turned off, the first node A is in a floating state. Since the first node A is in a floating state, due to a bootstrap action of the third capacitor C3, in order to maintain a voltage difference between two ends of the third capacitor C3, a potential of the first node A maintains a high potential in a previous period, so as to ensure that the third switching transistor M3, the fourth switching transistor M4, and the seventh switching transistor M7 are all turned off in this phase. Since the second switching transistor M2 and the third switching transistor M3 are both turned off, the second node B is in a floating state. Since the second node B is in a floating state, due to a bootstrap action of the first capacitor C1, thus, in order to maintain a voltage difference between two ends of the first capacitor C1, a potential of the second node B maintains a high potential in a previous period. Since a potential of the second node B is a high potential, the fifth switching transistor M5 is turned on. Since CK2=0, the sixth switching transistor is turned off, the third node C is in a floating state.

Since the third node C is in a floating state, due to a bootstrap action of the second capacitor C2, thus, in order to maintain a voltage difference between two ends of the second capacitor C2, a potential of the third node C maintains a low potential in a previous period, so as to ensure that the eighth switching transistor M8 is turned off in this phase; therefore, the driving signal output terminal Output maintains a high potential output state in a previous state through a capacitor on an output line of a display region.

In the first half of the phase T4, CK1=0, CK2=1, Input=1. Since CK1=0, the first switching transistor M1 and the second switching transistor M2 are both turned off. Since the first switching transistor M1 is turned off, the first node A is in a floating state. Since the first node A is in a floating state, due to a bootstrap action of the third capacitor C3, thus, in order to maintain a voltage difference between two ends of the third capacitor C3, a potential of the first node A maintains a low potential in a previous period, so as to ensure that the third switching transistor M3, the fourth switching transistor M4, and the seventh switching transistor M7 are all turned off in this phase. Since the second switching transistor M2 and the third switching transistor M3 are both turned off, the second node B is in a floating state. Since the second node B is in a floating state, due to a bootstrap action of the first capacitor C1, thus, in order to maintain a voltage difference between two ends of the first capacitor C1, a potential of the second node B is further pulled up, so as to ensure that the fifth switching transistor M5 is tuned on in this phase. Since CK2=1, the sixth switching transistor M6 is turned on. Since the fifth switching transistor M5 and the sixth switching transistor M6 are both turned on and the second DC signal V2 of a high potential is supplied to the third node C, a potential of the third node C is a high potential. Since a potential of the third node C is a high potential, the eighth switching transistor M8 is turned on, the second capacitor C2 starts to charge. Since the eighth switching transistor M8 is turned on and the first DC signal V1 of a low potential is supplied to the driving signal output terminal Output, the driving signal output terminal Output outputs a scanning signal of a low potential.

In the latter half of the phase T4, CK1=0, CK2=0, Input=1. Since CK1=0, the first switching transistor M1 and the second switching transistor M2 are both turned off. Since the first switching transistor M1 is turned off, the first node A is in a floating state. Since the first node A is in a floating state, due to a bootstrap action of the third capacitor C3, in order to maintain a voltage difference between two ends of the third capacitor C3, a potential of the first node A maintains a low potential in a previous period, so as to ensure that the third switching transistor M3, the fourth switching transistor M4, and the seventh switching transistor M7 are all turned off in this phase. Since the second switching transistor M2 and the third switching transistor M3 are both turned off, the second node B is in a floating state. Since the second node B is in a floating state, due to a bootstrap action of the first capacitor C1, thus, in order to maintain a voltage difference between two ends of the first capacitor C1, a potential of the second node B is a high potential. Since a potential of the second node B is a high potential, the fifth switching transistor M5 is turned on. Since CK2=0, the sixth switching transistor is turned off, the third node C is in a floating state. Since the third node C is in a floating state, due to a bootstrap action of the second capacitor C2, thus, in order to maintain a voltage difference between two ends of the second capacitor C2, a potential of the third node C is a low potential, so as to ensure that the eighth switching transistor M8 is turned off in this phase; therefore, the driving signal output terminal Output maintains a low potential output state in a previous state through a capacitor on an output line of a display region.

In the first half of the phase T5, CK1=1, CK2=0, Input=1. Since CK1=1, the first switching transistor M1 and the second switching transistor M2 are both turned on. Since the first switching transistor M1 is turned on and the input signal Input is supplied to the first node A, a potential of the first node A is a high potential. Since a potential of the first node A is a high potential, the third switching transistor M3, the fourth switching transistor M4, and the seventh switching transistor M7 are all turned on, the third capacitor C3 starts to charge. Since the second switching transistor M2 is turned on and potentials of the gate and the drain of the second switching transistor M2 are both high potentials, the second switching transistor M2 is in a saturated high-impedance state. Since the third switching transistor M3 is turned on and the first DC signal V1 of a low potential is supplied to the second node B, a potential of the second node B is a low potential, the first capacitor C1 starts to charge. Since a potential of the second node B is low potential, the fifth switching transistor M5 is turned off. Since CK2=1, the sixth switching transistor M6 is turned off. Since the fourth switching transistor M4 is turned on and the first DC signal V1 of a low potential is supplied to the third node C, a potential of the third node C is a low potential, the second capacitor C2 starts to charge. Since a potential of the third node C is a low potential, the eighth switching transistor M8 is turned off. Since the seventh switching transistor M7 is turned on and the second DC signal V2 of a high potential is supplied to the driving signal output terminal Output, the driving signal output terminal Output outputs a scanning signal of a high potential.

In the latter half of the phase T5, CK1=0, CK2=0, Input=1. Since CK1=0, the first switching transistor M1 and the second switching transistor M2 are both turned off. Since the since the first switching transistor M1 is turned off, the first node A is in a floating state. Since the first node A is in a floating state, due to a bootstrap action of the third capacitor C3, thus, in order to maintain a voltage difference between two ends of the third capacitor C3, a potential of the first node A maintains a high level in a previous period, so as to ensure that the third switching transistor M3, the fourth switching transistor M3, the switching transistor M4, and the seventh switching transistor M7 are all turned on in this phase. Since the third switching transistor M3 is turned on and the first DC signal V1 of a low potential is supplied to the second node B, a potential of the second node B is a low potential. Since a potential of the second node B is a low potential, the fifth switching transistor M5 is turned off. Since CK2=0, the sixth switching transistor M6 is turned off. Since the fourth switching transistor M4 is turned on and the first DC signal V1 of a low potential is supplied to the third node C, a potential of the third node C is a low potential. Since a potential of the third node C is a low potential, the eighth switching transistor M8 is turned off. Since the seventh switching transistor M7 is turned on and the second DC signal V2 of a high potential is supplied to the driving signal output terminal Output, the driving signal output terminal Output outputs a scanning signal of a high potential.

In the first half of the phase T6, CK1=0, CK2=1, Input=1. Since CK1=0, the first switching transistor M1 and the second switching transistor M2 are both turned off. Since the since the first switching transistor M1 is turned off, the first node A is in a floating state. Since the first node A is in a floating state, due to a bootstrap action of the third capacitor C3, thus, in order to maintain a voltage difference between two ends of the third capacitor C3, a potential of the first node A maintains a high level in a previous period, so as to ensure that the third switching transistor M3, the fourth switching transistor M3, the switching transistor M4, and the seventh switching transistor M7 are all turned on in this phase. Since the third switching transistor M3 is turned on and the first DC signal V1 of a low potential is supplied to the second node B, a potential of the second node B is a low potential. Since a potential of the second node B is a low potential, the fifth switching transistor M5 is turned off. Since the fourth switching transistor M4 is turned on and the first DC signal V1 of a low potential is supplied to the third node C, a potential of the third node C is a low potential. Since a potential of the third node C is a low potential, the eighth switching transistor M8 is turned off. Since the seventh switching transistor M7 is turned on and the second DC signal V2 of a high potential is supplied to the driving signal output terminal Output, the driving signal output terminal Output outputs a scanning signal of a high potential.

In the latter half of the phase T6, CK1=0, CK2=0, Input=1. Since CK1=0, the first switching transistor M1 and the second switching transistor M2 are both turned off. Since the first switching transistor M1 is turned off, the first node A is in a floating state. Since the first node A is in a floating state, due to a bootstrap action of the third capacitor C3, thus, in order to maintain a voltage difference between two ends of the third capacitor C3, a potential of the first node A maintains a high level in a previous period, so as to ensure that the third switching transistor M3, the fourth switching transistor M3, the switching transistor M4, and the seventh switching transistor M7 are all turned on in this phase. Since the third switching transistor M3 is turned on and the first DC signal V1 of a low potential is supplied to the second node B, a potential of the second node B is a low potential. Since a potential of the second node B is a low potential, the fifth switching transistor M5 is turned off. Since the fourth switching transistor M4 is turned on and the first DC signal V1 of a low potential is supplied to the third node C, a potential of the third node C is a low potential, the second capacitor C2 starts to charge. Since a potential of the third node C is a low potential, the eighth switching transistor M8 is turned off. Since the seventh switching transistor M7 is turned on and the second DC signal V2 of a high potential is supplied to the driving signal output terminal Output, the driving signal output terminal Output outputs a scanning signal of a high potential.

After the phase T6, the phase T5 and the phase T6 will be repeated until the next frame starts.

Fifth Embodiment

Figure 4B:
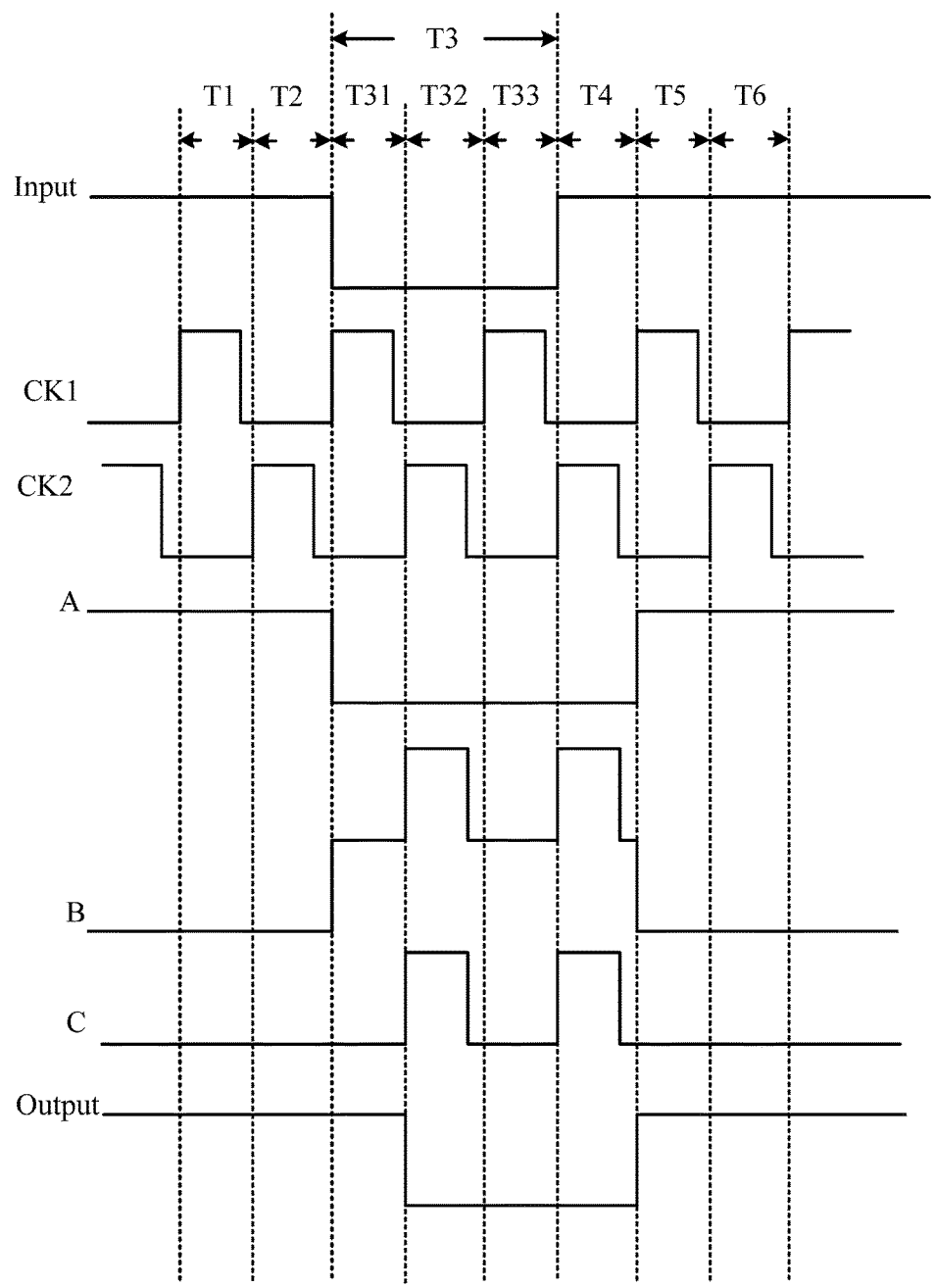

Operation process of the shift register is described with structure of the shift register shown in FIG. 2b as example. Based on the Fourth Embodiment, when a time length of the effective pulse signal of the input signal is extended by one clock signal cycle, the corresponding input output timing diagram is as shown in FIG. 4b. Sixth phases of T1, T2, T3, T4, T5, and T6 in the input output timing diagram shown in FIG. 4b are selected, wherein the phase T3 is further divided into five phases T31, T32, T33, T34, and T35.

In the first half of the phase T1, CK1=1, CK2=0, Input=1. In the latter half of the phase T1, CK1=0, CK2=0, Input=1. Operation process in this phase is the same as that in the phase T1 of the Fourth Embodiment, and no more details are repeated herein.

In the first half of the phase T2, CK1=0, CK2=1, Input=1. In the latter half of the phase T2, CK1=0, CK2=0, Input=1. Operation process in this phase is the same as that in the phase T2 of the Fourth Embodiment, and no more details are repeated herein.

In the first half of the phase T31, CK1=1, CK2=0, Input=0. Since CK1=1, the first switching transistor M1 and the second switching transistor M2 are both turned on. Since the first switching transistor M1 is turned on and the input signal Input is supplied to the first node A, a potential of the first node A is a low potential. Since a potential of the first node A is a low potential, the third switching transistor M3, the fourth switching transistor M4, and the seventh switching transistor M7 are all turned off, the third capacitor C3 starts to charge. Since the second switching transistor M2 is turned on and the second DC signal V2 of a high potential is supplied to the node B, a potential of the second node B is a high potential, the first capacitor C1 starts to charge. Since a potential of the second node B is a high potential, the fifth switching transistor M5 is turned on. Since CK2=0, the sixth switching transistor M6 is turned off, the third node C is in a floating state. Since the third node C is in a floating state, due to a bootstrap action of the second capacitor C2, thus, in order to maintain a voltage difference between two ends of the second capacitor C2, a potential of the third node C maintains a low potential in a previous period to ensure that the eighth switching transistor M8 is turned off in this phase; therefore, the driving signal output terminal Output maintains a high potential output state in a previous state through a capacitor on an output line of a display region.

In the latter half of the phase T31, CK1=0, CK2=0, Input=0. Since CK1=0, the first switching transistor M1 and the second switching transistor M2 are both turned off. Since the first switching transistor M1 is turned off, the first node A is in a floating state. Since the first node A is in the floating state, due to a bootstrap action of the third capacitor C3, thus, in order to maintain a voltage difference between two ends of the third capacitor C3, a potential of the first node A maintains a low potential in a previous period, so as to ensure that the third switching transistor M3, the fourth switching transistor M4, and the seventh switching transistor M7 are all turned off in this phase. Since the second switching transistor M2 and the third switching transistor M3 are both turned off, the second node B is in a floating state. Since the second node B is in a floating state, due to a bootstrap action of the first capacitor C1, thus, in order to maintain a voltage difference between two ends of the first capacitor C1, a potential of the second node B maintains a high potential in a previous period. Since a potential of the second node B is a high potential, the fifth switching transistor M5 is turned on. Since CK2=0, the sixth switching transistor is turned off, the third node C is in a floating state. Since the third node C is in a floating state, due to a bootstrap action of the second capacitor C2, thus, in order to maintain a voltage difference between two ends of the second capacitor C2, a potential of the third node C maintains a low potential in a previous period, so as to ensure that the eighth switching transistor M8 is turned off in this phase; therefore, the driving signal output terminal Output maintains a high potential output state in a previous state through a capacitor on an output line of a display region.

In the first half of the phase T32, CK1=0, CK2=1, Input=0. Since CK1=0, the first switching transistor M1 and the second switching transistor M2 are both turned off. Since the first switching transistor M1 is turned off, the first node A is in a floating state. Since the first node A is in a floating state, due to a bootstrap action of the third capacitor C3, thus, in order to maintain a voltage difference between two ends of the third capacitor C3, a potential of the first node A maintains a low potential in a previous period, so as to ensure that the third switching transistor M3, the fourth switching transistor M4, and the seventh switching transistor M7 are all turned off in this phase. Since the second switching transistor M2 and the third switching transistor M3 are both turned off, the second node B is in a floating state. Since the second node B is in a floating state, due to a bootstrap action of the first capacitor C1, thus, in order to maintain a voltage difference between two ends of the first capacitor C1, a potential of the second node B is further pulled up, so as to ensure that the fifth switching transistor M5 is tuned on in this phase. Since CK2=1, the sixth switching transistor M6 is turned on. Since the fifth switching transistor M5 and the sixth switching transistor M6 are both turned on and the second DC signal V2 of a high potential is supplied to the third node C, a potential of the third node C is a high potential. Since a potential of the third node C is a high potential, the eighth switching transistor M8 is turned on, the second capacitor C2 starts to charge. Since the eighth switching transistor M8 is turned on and the first DC signal V1 of a low potential is supplied to the driving signal output terminal Output, the driving signal output terminal Output outputs a scanning signal of a low potential.

In the latter half of the phase T32, CK1=0, CK2=0, Input=0. Since CK1=0, the first switching transistor M1 and the second switching transistor M2 are both turned off. Since the first switching transistor M1 is turned off, the first node A is in a floating state. Since the first node A is in the floating state, due to a bootstrap action of the third capacitor C3, in order to maintain a voltage difference between two ends of the third capacitor C3, a potential of the first node A maintains a low potential in a previous period, so as to ensure that the third switching transistor M3, the fourth switching transistor M4, and the seventh switching transistor M7 are all turned off in this phase. Since the second switching transistor M2 and the third switching transistor M3 are both turned off, the second node B is in a floating state. Since the second node B is in a floating state, due to a bootstrap action of the first capacitor C1, thus, in order to maintain a voltage difference between two ends of the first capacitor C1, a potential of the second node B is a high potential. Since a potential of the second node B is a high potential, the fifth switching transistor M5 is turned on. Since CK2=0, the sixth switching transistor M6 is turned off, the third node C is in a floating state. Since the third node C is in a floating state, due to a bootstrap action of the second capacitor C2, thus, in order to maintain a voltage difference between two ends of the second capacitor C2, a potential of the third node C is a low potential, so as to ensure that the eighth switching transistor M8 is turned off in this phase; therefore, the driving signal output terminal Output maintains a low potential output state in a previous state through a capacitor on an output line of a display region.

In the first half of the phase T33, CK1=1, CK2=0, Input=0. Since CK1=1, the first switching transistor M1 and the second switching transistor M2 are both turned on. Since the first switching transistor M1 is turned on and the input signal Input is supplied to the first node A, a potential of the first node A is a low potential. Since a potential of the first node A is a low potential, the third switching transistor M3, the fourth switching transistor M4, and the seventh switching transistor M7 are all turned off, the third capacitor C3 starts to charge. Since the second switching transistor M2 is turned on and the second DC signal V2 of a high potential is supplied to the second node B, a potential of the second node B is a high potential, the first capacitor C1 starts to charge. Since a potential of the second node B is a high potential, the fifth switching transistor M5 is turned on. Since CK2=0, the sixth switching transistor is turned off, the third node C is in a floating state; the third node C is in a floating state. Since the third node C is in a floating state, due to a bootstrap action of the second capacitor C2, thus, in order to maintain a voltage difference between two ends of the second capacitor C2, a potential of the third node C maintains a low potential in a previous period to ensure that the eighth switching transistor M8 is turned off in this phase; therefore, the driving signal output terminal Output maintains a low potential output state in a previous state through a capacitor on an output line of a display region.

In the latter half of the phase T33, CK1=0, CK2=0, Input=0. Since CK1=0, the first switching transistor M1 and the second switching transistor M2 are both turned off. Since the first switching transistor M1 is turned off, the first node A is in a floating state. Since the first node A is in a floating state, due to a bootstrap action of the third capacitor C3, thus, in order to maintain a voltage difference between two ends of the third capacitor C3, a potential of the first node A maintains a low potential in a previous period, so as to ensure that the third switching transistor M3, the fourth switching transistor M4, and the seventh switching transistor M7 are all turned off in this phase. Since the second switching transistor M2 and the third switching transistor M3 are both turned off, the second node B is in a floating state. Since the second node B is in a floating state, due to a bootstrap action of the first capacitor C1, thus, in order to maintain a voltage difference between two ends of the first capacitor C1, a potential of the second node B maintains a high potential in a previous period. Since a potential of the second node B is a high potential, the fifth switching transistor M5 is turned on. Since CK2=0, the sixth switching transistor is turned off, the third node C is in a floating state. Since the third node C is in a floating state, due to a bootstrap action of the second capacitor C2, thus, in order to maintain a voltage difference between two ends of the second capacitor C2, a potential of the third node C maintains a low potential in a previous period, so as to ensure that the eighth switching transistor M8 is turned off in this phase; therefore, the driving signal output terminal Output maintains a low potential output state in a previous state through a capacitor on an output line of a display region.

In the first half of the phase T4, CK1=0, CK2=1, Input=1. In the latter half of the phase T4, CK1=0, CK2=0, Input=1. Operation process in this phase is the same as that in the phase T4 in the Fourth Embodiment, and no more details are repeated herein.

In the first half of T5 phase the, CK1=1, CK2=0, Input=1. In the latter half of the phase T5, CK1=0, CK2=0, Input=1. Operation process in this phase is the same as that in the phase T5 in the Fourth Embodiment, and no more details are repeated herein.

In the first half of the phase T6, CK1=0, CK2=1, Input=1. In the latter half of the phase T6, CK1=0, CK2=0, Input=1. Operation process in this phase is the same as that in the phase T6 in the Fourth Embodiment, and no more details are repeated herein.

After the phase T6, the phase T5 and the phase T6 will be repeated until the next frame starts.

Sixth Embodiment

Figure 4C:
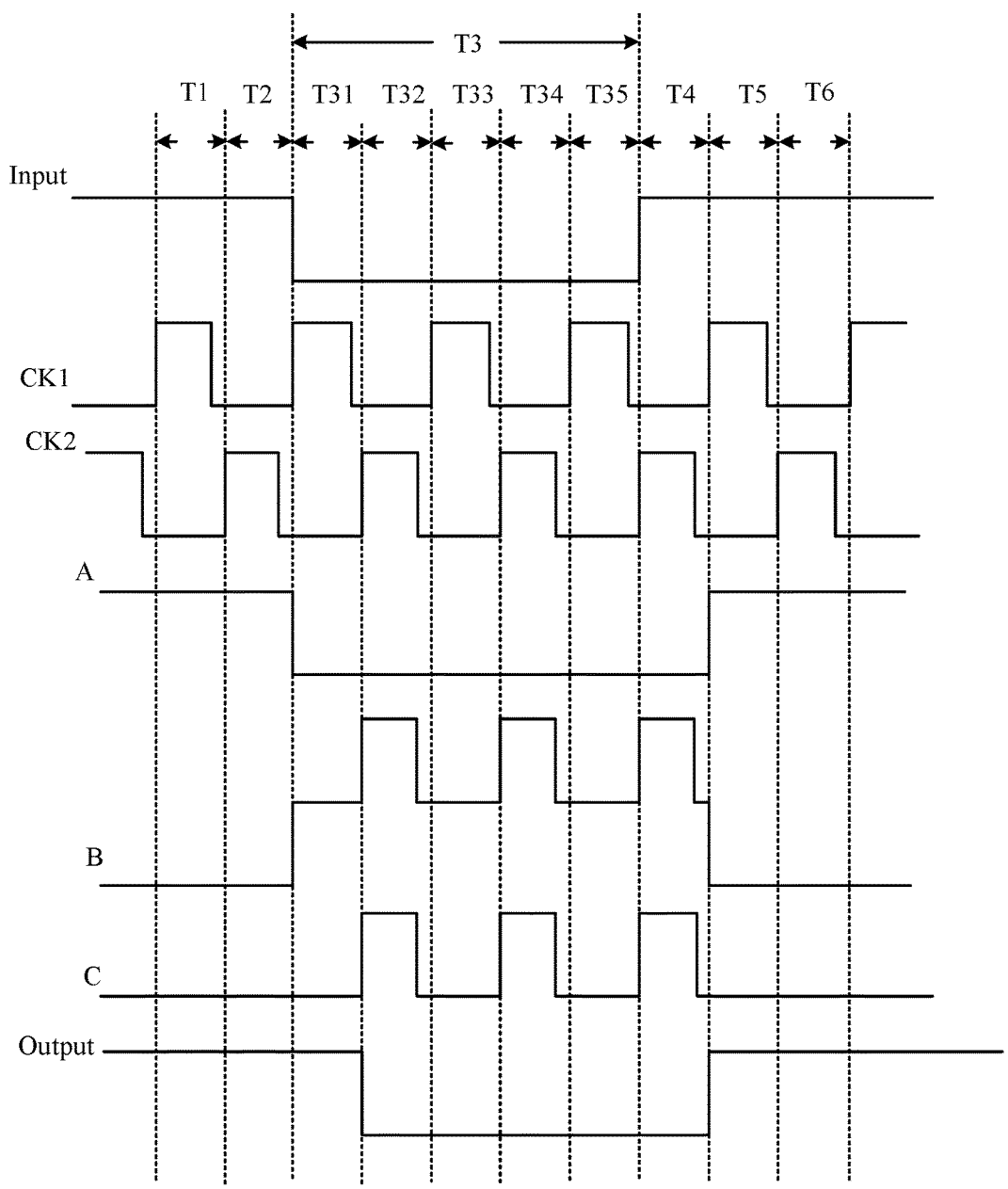

Operation process of the shift register is described with structure of the shift register shown in FIG. 2b as example. Based on the Fifth Embodiment, when a time length of the effective pulse signal of the input signal is extended by one clock signal cycle, the corresponding input output timing diagram is as shown in FIG. 4c. Sixth phases of T1, T2, T3, T4, T5, and T6 in the input output timing diagram shown in FIG. 4c are selected, wherein the phase T3 is further divided into five phases T31, T32, T33, T34, and T35.

In the first half of the phase T1, CK1=1, CK2=0, Input=1. In the latter half of the phase T1, CK1=0, CK2=0, Input=1. Operation process in this phase is the same as that in the phase T1 of the Fourth Embodiment, and no more details are repeated herein.

In the first half of the phase T2, CK1=0, CK2=1, Input=1. In the latter half of the phase T2, CK1=0, CK2=0, Input=1. Operation process in this phase is the same as that in the phase T2 of the Fourth Embodiment, and no more details are repeated herein.

In the first half of the phase 31, CK1=1, CK2=0, Input=0. In the latter half of the phase T31, CK1=0, CK2=0, Input=0. Operation process in this phase is the same as that in the phase T31 of phase T3 of the Fifth Embodiment, and no more details are repeated herein.

In the first half of the phase T32, CK1=0, CK2=1, Input=0. In the latter half of the phase T32, CK1=0, CK2=0, Input=0. Operation process in this phase is the same as that in the phase T32 of T3 of the Fifth Embodiment, and no more details are repeated herein.

In the first half of the phase T33, CK1=1, CK2=0, Input=0. Since CK1=1, the first switching transistor M1 and the second switching transistor M2 are both turned on. Since the first switching transistor M1 is turned on and the input signal Input is supplied to the first node A, a potential of the first node A is a low potential. Since a potential of the first node A is a low potential, the third switching transistor M3, the fourth switching transistor M4, and the seventh switching transistor M7 are all turned off, the third capacitor C3 starts to charge. Since the second switching transistor M2 is turned on and the second DC signal V2 of a high potential is supplied to the node B, a potential of the second node B is a high potential, the first capacitor C1 starts to charge. Since a potential of the second node B is a high potential, the fifth switching transistor M5 is turned on. Since CK2=0, the sixth switching transistor M6 is turned off, the third node C is in a floating state. Since the third node C is in a floating state, due to a bootstrap action of the second capacitor C2, thus, in order to maintain a voltage difference between two ends of the second capacitor C2, a potential of the third node C maintains a low potential in a previous period to ensure that the eighth switching transistor M8 is turned off in this phase; therefore, the driving signal output terminal Output maintains a high potential output state in a previous state through a capacitor on an output line of a display region.

In the latter half of the phase T33, CK1=0, CK2=0, Input=0. Since CK1=0, the first switching transistor M1 and the second switching transistor M2 are both turned off. Since the first switching transistor M1 is turned off, the first node A is in a floating state. Since the first node A is in a floating state, due to a bootstrap action of the third capacitor C3, in order to maintain a voltage difference between two ends of the third capacitor C3, a potential of the first node A maintains a low potential in a previous period, so as to ensure that the third switching transistor M3, the fourth switching transistor M4, and the seventh switching transistor M7 are all turned off in this phase. Since the second switching transistor M2 and the third switching transistor M3 are both turned off, the second node B is in a floating state. Since the second node B is in a floating state, due to a bootstrap action of the first capacitor C1, thus, in order to maintain a voltage difference between two ends of the first capacitor C1, a potential of the second node B maintains a high potential in a previous period. Since a potential of the second node B is a high potential, the fifth switching transistor M5 is turned on. Since CK2=0, the sixth switching transistor M6 is turned off, the third node C is in a floating state. Since the third node C is in a floating state, due to a bootstrap action of the second capacitor C2, thus, in order to maintain a voltage difference between two ends of the second capacitor C2, a potential of the third node C maintains a low potential in a previous period, so as to ensure that the eighth switching transistor M8 is turned off in this phase; therefore, the driving signal output terminal Output maintains a high potential output state in a previous state through a capacitor on an output line of a display region. Operation process in the phase T33 is the same as that in the phase T31.

In the first half of the phase T34, CK1=0, CK2=1, Input=0. Since CK1=0, the first switching transistor M1 and the second switching transistor M2 are both turned off. Since the first switching transistor M1 is turned off, the first node A is in a floating state. Since the first node A is in a floating state, due to a bootstrap action of the third capacitor C3, thus, in order to maintain a voltage difference between two ends of the third capacitor C3, a potential of the first node A maintains a low potential in a previous period, so as to ensure that the third switching transistor M3, the fourth switching transistor M4, and the seventh switching transistor M7 are all turned off in this phase. Since the second switching transistor M2 and the third switching transistor M3 are both turned off, the second node B is in a floating state. Since the second node B is in a floating state, due to a bootstrap action of the first capacitor C1, thus, in order to maintain a voltage difference between two ends of the first capacitor C1, a potential of the second node B is further pulled up, so as to ensure that the fifth switching transistor M5 is tuned on in this phase. Since CK2=1, the sixth switching transistor M6 is turned on. Since the fifth switching transistor M5 and the sixth switching transistor M6 are both turned on and the second DC signal V2 of a high potential is supplied to the third node C, a potential of the third node C is a high potential. Since a potential of the third node C is a high potential, the eighth switching transistor M8 is turned on, the second capacitor C2 starts to charge. Since the eighth switching transistor M8 is turned on and the first DC signal V1 of a low potential is supplied to the driving signal output terminal Output, the driving signal output terminal Output outputs a scanning signal of a low potential.

In the latter half of the phase T34, CK1=0, CK2=0, Input=0. Since CK1=0, the first switching transistor M1 and the second switching transistor M2 are both turned off. Since the first switching transistor M1 is turned off, the first node A is in a floating state. Since the first node A is in a floating state, due to a bootstrap action of the third capacitor C3, in order to maintain a voltage difference between two ends of the third capacitor C3, a potential of the first node A maintains a low potential in a previous period, so as to ensure that the third switching transistor M3, the fourth switching transistor M4, and the seventh switching transistor M7 are all turned off in this phase. Since the second switching transistor M2 and the third switching transistor M3 are both turned off, the second node B is in a floating state. Since the second node B is in a floating state, due to a bootstrap action of the first capacitor C1, thus, in order to maintain a voltage difference between two ends of the first capacitor C1, a potential of the second node B is a high potential. Since a potential of the second node B is a high potential, the fifth switching transistor M5 is turned on. Since CK2=0, the sixth switching transistor M6 is turned off, the third node C is in a floating state. Since the third node C is in a floating state, due to a bootstrap action of the second capacitor C2, thus, in order to maintain a voltage difference between two ends of the second capacitor C2, a potential of the third node C maintains a low potential in a previous period to ensure that the eighth switching transistor M8 is turned off in this phase; therefore, the driving signal output terminal Output maintains a low potential output state in a previous state through a capacitor on an output line of a display region.

In the first half of the phase T35, CK1=1, CK2=0, Input=0. Since CK1=1, the first switching transistor M1 and the second switching transistor M2 are both turned on. Since the first switching transistor M1 is turned on and the input signal Input is supplied to the first node A, a potential of the first node A is a low potential. Since a potential of the first node A is a low potential, the third switching transistor M3, the fourth switching transistor M4, and the seventh switching transistor M7 are all turned off, the third capacitor C3 starts to charge. Since the second switching transistor M2 is turned on and the second DC signal V2 of a high potential is supplied to the node B, a potential of the second node B is a high potential, the first capacitor C1 starts to charge. Since a potential of the second node B is a high potential, the fifth switching transistor is turned on. Since CK2=0, the sixth switching transistor M6 is turned off, the third node C is in a floating state. Since the third node C is in a floating state, due to a bootstrap action of the second capacitor C2, thus, in order to maintain a voltage difference between two ends of the second capacitor C2, a potential of the third node C maintains a low potential in a previous period to ensure that the eighth switching transistor M8 is turned off in this phase; therefore, the driving signal output terminal Output maintains a low potential output state in a previous state through a capacitor on an output line of a display region.

In the latter half of the phase T35, CK0=1, CK2=0, Input=0. Since CK1=0, the first switching transistor M1 and the second switching transistor M2 are both turned off. Since the first switching transistor M1 is turned off, the first node A is in a floating state. Since the first node A is in a floating state, due to a bootstrap action of the third capacitor C3, thus, in order to maintain a voltage difference between two ends of the third capacitor C3, a potential of the first node A maintains a low potential in a previous period, so as to ensure that the third switching transistor M3, the fourth switching transistor M4, and the seventh switching transistor M7 are all turned off in this phase. Since the second switching transistor M2 and the third switching transistor M3 are both turned off, the second node B is in a floating state. Since the second node B is in a floating state, due to a bootstrap action of the first capacitor C1, thus, in order to maintain a voltage difference between two ends of the first capacitor C1, a potential of the second node B maintains a high potential in a previous period. Since a potential of the second node B is a high potential, the fifth switching transistor M5 is turned on. Since CK2=0, the sixth switching transistor M6 is turned off, the third node C is in a floating state. Since the third node C is in a floating state, due to a bootstrap action of the second capacitor C2, thus, in order to maintain a voltage difference between two ends of the second capacitor C2, a potential of the third node C maintains a low potential in a previous period to ensure that the eighth switching transistor M8 is turned off in this phase; therefore, the driving signal output terminal Output maintains a low potential output state in a previous state through a capacitor on an output line of a display region. Operation process in the phase T35 is the same as that in the phase T33

In the first half of the phase T4, CK1=0, CK2=1, Input=1.
In the latter half of the phase T4, CK1=0, CK2=0, Input=1. Operation process in this phase is the same as that in the phase T4 in the Fourth Embodiment, and no more details are repeated herein.

In the first half of T5 phase the, CK1=1, CK2=0, Input=1.
In the latter half of the phase T5, CK1=0, CK2=0, Input=1. Operation process in this phase is the same as that in the phase T5 in the Fourth Embodiment, and no more details are repeated herein.

In the first half of the phase T6, CK1=0, CK2=1, Input=1.
In the latter half of the phase T6, CK1=0, CK2=0, Input=1. Operation process in this phase is the same as that in the phase T6 in the Fourth Embodiment, and no more details are repeated herein.

After the phase T6, the phase T5 and the phase T6 will be repeated until the next frame starts.

The shift register provided in the embodiment of the present disclosure can, based on the input signal in the Fourth Embodiment, output the scanning signal of the corresponding time length in the Fifth Embodiment by extending a time length of the effective pulse signal of the input signal by one clock signal cycle, and output the scanning signal of the corresponding time length in the Sixth Embodiment by extending a time length of the effective pulse signal of the input signal by two clock signal cycles, and so on. And thus, it is possible to achieve a scanning signal with a time length the same as that of the effective pulse signal of the input signal by means of extending the time length of the effective pulse signal.

Thus, the shift register provided by the present disclosure can control a time length of the scanning signal outputted from the driving signal output terminal only by changing a time length of the input signal without changing the clock signal or the circuit or the manufacturing process. Therefore, the shift register provided by the present disclosure can reduce difficulty of the gate driving circuit and complexity of the manufacturing process as well as the cost, as compared with the manner of using a plurality of types of clock control signals to control a time length of the scanning signal outputted from the driving signal output terminal.

Figure 5:
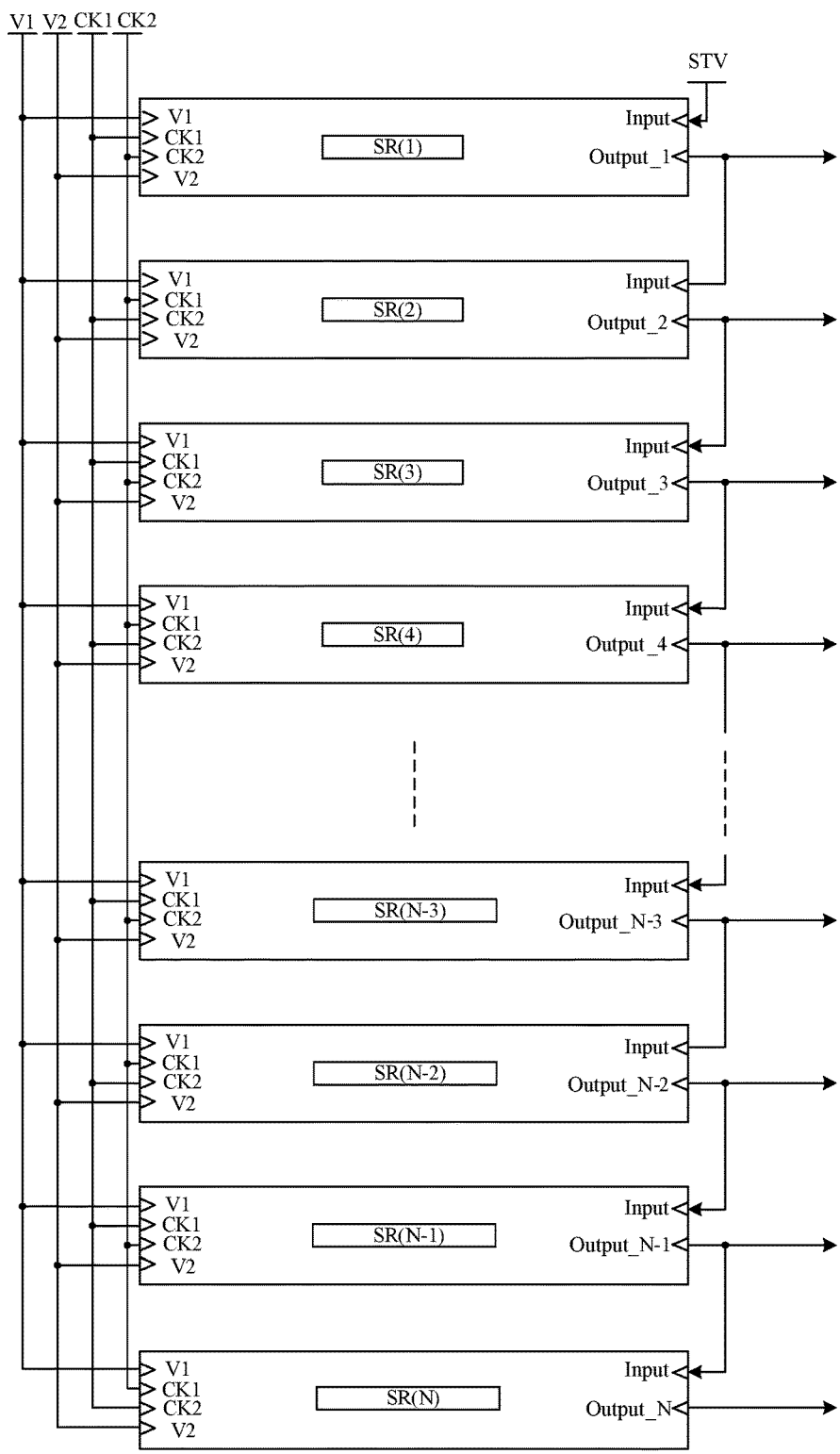
FIG. 5 is a schematic diagram of structure of the gate driving circuit provided by an embodiment of the present disclosure.

FIG. 5 illustrates the gate driving circuit provided by an embodiment of the present disclosure.

As shown in FIG. 5, the gate driving circuit comprises a plurality of cascaded shift register SR(1), SR(2), . . . , SR(N-1) and SR(N) (totally, N shift registers, $1 \leq n \leq N$), wherein an input signal of the shift register SR(1) in a first stage is inputted by a start signal terminal STV, and except the shift register SR(1) in the first stage, an input signal of the shift register in each stage SR(n) is inputted via a driving signal output terminal Output_n-1 of the shift register SR(n-1) connected thereto in a previous stage.

Further, in the above gate driving circuit, the first clock signal CK1, the second clock signal CK2, the first DC signal V1, and the second DC signal V2 are all inputted into the shift register in the respective stages.

Structure and function of each of the shift registers in the gate driving circuit described above are the same as those of the shift register provided by the present disclosure, and no more details are repeated herein. The gate driving circuit may be applied to a liquid crystal display panel (LCD) or an organic electroluminescent (OLED) display panel, and no limitations are made herein.

In the OLED display panel, usually, a scanning time length of the adopted gate driving circuit is fixed. For special timing requirements of the OLED display panel, it is required that each row of pixels in the OLED display panel must be in a light-emitting state after the scanning starts.

Therefore, such gate driving circuit will cause the light-emitting time of each row of pixels in the display panel to be difficult to adjust.

However, the above-described gate driving circuit provided by the present disclosure can control the time length of the scanning signal outputted from the driving signal output terminal by means of changing the time length of the input signal, so that it can be applied to the OLED display panel and control the light-emitting time of each row of pixels by controlling the scanning time, thereby control a light-emitting luminance of the OLED display panel.

The present disclosure further provides a display device, comprising the gate driving circuit described above, wherein scanning signals are supplied to the respective gate lines of the display panel in the display device by the gate driving circuit.

In the shift register provided by the present disclosure, the input module adjusts a potential of the first node through the input signal and the first clock signal, the first control module adjusts a potential of the second node through the first clock signal, the second clock signal, the first DC signal, the second DC signal and the first node, the second control module adjusts a potential of the third node through the second clock signal, the first DC signal, the second DC signal, the first node and the second node, the first output module adjusts a potential of the driving signal output terminal through the second DC signal and the first node, and the second output module adjusts a potential of the driving signal output terminal through the first DC signal and the second node. Thus, the shift register provided by the present disclosure can control a time length of the scanning signal outputted from the driving signal output terminal only by changing a time length of the input signal without changing the clock signal or the circuit or the manufacturing process. Accordingly, the shift register provided by the present disclosure can reduce difficulty of the gate driving circuit and complexity of the manufacturing process as well as the cost, as compared with the manner of using a plurality of types of clock control signals to control a time length of the scanning signal outputted from the driving signal output terminal.

Apparently, a person skill in the art can make various modifications and variations to the present disclosure without departing from the spirit and scope thereof. The present disclosure is also intended to include these modifications and variations.

The present application claims priority right of Chinese Patent Application No. 201510600147.9 filed on Sep. 18, 2015, the disclosure of which is incorporated in entirety herein by reference as a portion of the present application.

What is claimed is:

1. A shift register, comprising
an input module having a first terminal for receiving an input signal, a second terminal for receiving a first clock signal and a third terminal connected to a first node, wherein the input module supplies the input signal to the first node when a potential of the first clock signal is a first potential,
a first control module having a first terminal for receiving the first clock signal, a second terminal for receiving a second clock signal, a third terminal for receiving a first DC signal, a fourth terminal for receiving a second DC signal, a fifth terminal connected to the first node and a sixth terminal connected to a second node, wherein the first control module supplies the first DC signal to the second node when a potential of the first node is a first potential, supplies the second DC signal to the second node when a potential of the first clock signal is a first potential, and maintains a voltage difference between the second terminal and the second node at current voltage difference when the second node is in a floating state,
a second control module having a first terminal for receiving the second clock signal, a second terminal for receiving the first DC signal, a third terminal for receiving the second DC signal, a fourth terminal connected to the first node, a fifth terminal connected to the second node and a sixth terminal connected to a third node, wherein the second control module supplies the first DC signal to the third node when a potential of the first node is a first potential, supplies the second DC signal to the third node when a potential of the second clock signal and a potential of the second node are both first potentials, and maintains a voltage difference between the first terminal thereof and the third node at current voltage difference when the third node is in a floating state,
a first output module having a first terminal for receiving the second DC signal, a second terminal connected to the first node and a third terminal connected to a driving signal output terminal of the shift register, wherein the first output module supplies the second DC signal to the driving signal output terminal when a potential of the first node is a first potential, and maintains a voltage difference between the first node and the driving signal output terminal at current voltage difference when the first node is in a floating state, and
a second output module having a first terminal for receiving the first DC signal, a second terminal connected to the third node and a third terminal connected to the driving signal output terminal, wherein the second output module supplies the first DC signal to the driving signal output terminal when a potential of the third node is a first potential.

2. The shift register according to claim 1, wherein
in a case where an effective pulse signal of the input signal is a high potential, the first potential is a low potential, the first DC signal is a high potential, and the second DC signal is a low potential, and
in a case where an effective pulse signal of the input signal is a low potential, the first potential is a high potential, the first DC signal is a low potential, and the second DC signal is a high potential.

3. The shift register according to claim 1, wherein the input module comprises
a first switching transistor having a gate for receiving the first clock signal, a source for receiving the input signal and a drain connected to the first node.

4. The shift register according to claim 1, wherein the first control module comprises
a second switching transistor having a gate for receiving the first clock signal, a source for receiving the second DC signal and a drain connected to the second node,
a third switching transistor having a gate connected to the first node, a source for receiving the first DC signal and a drain connected to the second node, and
a first capacitor having one terminal for receiving the second clock signal, and the other terminal connected to the second node.

5. The shift register according to claim 1, wherein the second control module comprises
a fourth switching transistor having a gate connected to the first node, a source for receiving the first DC signal and a drain connected to the third node, a fifth switching transistor having a gate connected to the second node, a source for receiving the second DC signal and a drain connected to a source of a sixth switching transistor, the sixth switching transistor having a gate for receiving the second clock signal and a drain connected to the third node, and a second capacitor having one terminal for receiving the second clock signal and the other terminal connected to the third node.

6. The shift register according to claim 1, wherein the first output module comprises a seventh switching transistor having a gate connected to the first node, a source for receiving the second DC signal and a drain connected to the driving signal output terminal, and a third capacitor having one terminal connected to the first node and the other terminal connected to the driving signal output terminal.

7. The shift register according to claim 1, wherein the second output module comprises an eighth switching transistor having a gate connected to the third node, a source for receiving the first DC signal and a drain connected to the driving signal output terminal.

8. The shift register according to claim 3, wherein in a case where an effective pulse signal of the input signal is a high potential, all the switching transistors are P-type switching transistors, and in a case where an effective pulse signal of the input signal is a low potential, all the switching transistors are N-type switching transistors.

9. The shift register according to claim 1, wherein the first clock signal and the second clock signal have the same cycle and the same duty ratio, in a case where an effective pulse signal of the input signal is a high potential, a rising edge of the input signal and a falling edge of the first clock signal are aligned, a falling edge of the input signal and a falling edge of the second clock signal are aligned, a period with the first clock signal being a low potential within one cycle resides during a period with the second clock signal being a high potential within one cycle, and the duty ratio of the first clock signal and the duty ratio of the second clock are both greater than 0.5, and in a case where an effective pulse signal of the input signal is a low potential, a falling edge of the input signal and a rising edge of the first clock signal are aligned, a rising edge of the input signal and a rising edge of the second clock signal are aligned, a period with the first clock signal being a high potential within one cycle resides during a period with the second clock signal being a low potential within one cycle, and the duty ratio of the first clock signal and the duty ratio of the second clock are both smaller than 0.5.

10. A gate driving circuit, comprising a plurality of cascaded shift registers according to claim 1, wherein an input signal of the shift register in a first stage is inputted via a start signal terminal, and except the shift register in the first stage, an input signal of the shift register in each stage is inputted via a driving signal output terminal of the shift register connected thereto in a previous stage.

11. A display device, comprising the gate driving circuit according to claim 10.

12. The gate driving circuit according to 10, wherein in a case where an effective pulse signal of the input signal is a high potential, the first potential is a low potential, the first DC signal is a high potential, and the second DC signal is a low potential, and in a case where an effective pulse signal of the input signal is a low potential, the first potential is a high potential, the first DC signal is a low potential, and the second DC signal is a high potential.

13. The gate driving circuit according to 10, wherein the input module in the shift register comprises a first switching transistor having a gate for receiving the first clock signal, a source for receiving the input signal and a drain connected to the first node.

14. The gate driving circuit according to 10, wherein the first control module in the shift register comprises a second switching transistor having a gate for receiving the first clock signal, a source for receiving the second DC signal and a drain connected to the second node, a third switching transistor having a gate connected to the first node, a source for receiving the first DC signal and a drain connected to the second node, and a first capacitor having one terminal for receiving the second clock signal, and the other terminal connected to the second node.

15. The gate driving circuit according to 10, wherein the second control module in the shift register comprises a fourth switching transistor having a gate connected to the first node, a source for receiving the first DC signal and a drain connected to the third node, a fifth switching transistor having a gate connected to the second node, a source for receiving the second DC signal and a drain connected to a source of a sixth switching transistor, the sixth switching transistor having a gate for receiving the second clock signal and a drain connected to the third node, and a second capacitor having one terminal for receiving the second clock signal and the other terminal connected to the third node.

16. The gate driving circuit according to 10, wherein the first output module in the shift register comprises a seventh switching transistor having a gate connected to the first node, a source for receiving the second DC signal and a drain connected to the driving signal output terminal, and a third capacitor having one terminal connected to the first node and the other terminal connected to the driving signal output terminal.

17. The gate driving circuit according to 10, wherein the second output module in the shift register comprises an eighth switching transistor having a gate connected to the third node, a source for receiving the first DC signal and a drain connected to the driving signal output terminal.

18. The gate driving circuit according to 10, wherein the first clock signal and the second clock signal have the same cycle and the same duty ratio, in a case where an effective pulse signal of the input signal is a high potential, a rising edge of the input signal and a falling edge of the first clock signal are aligned, a falling edge of the input signal and a falling edge of the second clock signal are aligned, a period with the first clock signal being a low potential within one cycle resides during a period with the second clock signal being a high potential within one cycle, and the duty ratio of the first clock signal and the duty ratio of the second clock are both greater than 0.5, and in a case where an effective pulse signal of the input signal is a low potential, a falling edge of the input signal and a rising edge of the first clock signal are aligned, a rising edge of the input signal and a rising edge of the second clock signal are aligned, a period with the first clock signal being a high potential within one cycle resides during a period with the second clock signal being a low potential within one cycle, and the duty ratio of the first clock signal and the duty ratio of the second clock are both smaller than 0.5.

19. The display device according to claim 11, wherein
in a case where an effective pulse signal of the input signal is a high potential, the first potential is a low potential, the first DC signal is a high potential, and the second DC signal is a low potential, and
in a case where an effective pulse signal of the input signal is a low potential, the first potential is a high potential, the first DC signal is a low potential, and the second DC signal is a high potential.

20. The display device according to claim 11, wherein the first clock signal and the second clock signal have the same cycle and the same duty ratio, in a case where an effective pulse signal of the input signal is a high potential, a rising edge of the input signal and a falling edge of the first clock signal are aligned, a falling edge of the input signal and a falling edge of the second clock signal are aligned, a period with the first clock signal being a low potential within one cycle resides during a period with the second clock signal being a high potential within one cycle, and the duty ratio of the first clock signal and the duty ratio of the second clock are both greater than 0.5, and in a case where an effective pulse signal of the input signal is a low potential, a falling edge of the input signal and a rising edge of the first clock signal are aligned, a rising edge of the input signal and a rising edge of the second clock signal are aligned, a period with the first clock signal being a high potential within one cycle resides during a period with the second clock signal being a low potential within one cycle, and the duty ratio of the first clock signal and the duty ratio of the second clock are both smaller than 0.5.

* * * * *